United States Patent
Yu et al.

(10) Patent No.: US 11,177,434 B2
(45) Date of Patent: *Nov. 16, 2021

(54) CHIP PACKAGE

(71) Applicant: Taiwan Semiconductor Manufacturing Co., Ltd., Hsinchu (TW)

(72) Inventors: Chen-Hua Yu, Hsinchu (TW); Kuo-Chung Yee, Taoyuan (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 16/991,039

(22) Filed: Aug. 12, 2020

(65) Prior Publication Data
US 2020/0373485 A1 Nov. 26, 2020

Related U.S. Application Data

(63) Continuation of application No. 16/542,284, filed on Aug. 15, 2019, which is a continuation of application No. 15/253,887, filed on Sep. 1, 2016, now Pat. No. 10,431,738.

(60) Provisional application No. 62/354,117, filed on Jun. 24, 2016.

(51) Int. Cl.
| | |
|---|---|
| *H01L 29/40* | (2006.01) |
| *H01L 21/44* | (2006.01) |
| *H01L 45/00* | (2006.01) |
| *H01L 23/00* | (2006.01) |
| *H01L 25/065* | (2006.01) |
| *H01L 25/18* | (2006.01) |

(52) U.S. Cl.
CPC .......... *H01L 45/1233* (2013.01); *H01L 24/18* (2013.01); *H01L 25/0652* (2013.01); *H01L 25/18* (2013.01); *H01L 2221/1026* (2013.01); *H01L 2224/11* (2013.01); *H01L 2225/06513* (2013.01); *H01L 2225/06527* (2013.01); *H01L 2225/06541* (2013.01); *H01L 2225/06589* (2013.01); *H01L 2924/10253* (2013.01); *H01L 2924/15311* (2013.01)

(58) Field of Classification Search
CPC .................................................. H01L 45/1233
USPC .......................... 438/668, 672, 675; 257/775
See application file for complete search history.

(56) References Cited

U.S. PATENT DOCUMENTS

| | | | |
|---|---|---|---|
| 7,820,526 B2 * | 10/2010 | Yamada | ................. H01L 24/97 438/458 |
| 9,000,584 B2 | 4/2015 | Lin et al. | |
| 9,048,222 B2 | 6/2015 | Hung et al. | |
| 9,048,233 B2 | 6/2015 | Wu et al. | |

(Continued)

*Primary Examiner* — Calvin Lee
(74) *Attorney, Agent, or Firm* — JCIPRNET

(57) ABSTRACT

An integrated fan-out package including an integrated circuit, a plurality of memory devices, an insulating encapsulation, and a redistribution circuit structure is provided. The memory devices are electrically connected to the integrated circuit. The integrated circuit and the memory devices are stacked, and the memory devices are embedded in the insulating encapsulation. The redistribution circuit structure is disposed on the insulating encapsulation, and the redistribution circuit structure is electrically connected to the integrated circuit and the memory devices. Furthermore, methods for fabricating the integrated fan-out package are also provided.

20 Claims, 25 Drawing Sheets

(56) References Cited

U.S. PATENT DOCUMENTS

| | | |
|---|---|---|
| 9,064,879 B2 | 6/2015 | Hung et al. |
| 9,111,949 B2 | 8/2015 | Yu et al. |
| 9,263,511 B2 | 2/2016 | Yu et al. |
| 9,281,254 B2 | 3/2016 | Yu et al. |
| 9,368,460 B2 | 6/2016 | Yu et al. |
| 9,372,206 B2 | 6/2016 | Wu et al. |
| 9,496,189 B2 | 11/2016 | Yu et al. |
| 10,431,738 B2 * | 10/2019 | Yu ........................ H01L 25/0652 438/668 |
| 10,770,655 B2 * | 9/2020 | Yu ........................... H01L 24/94 257/775 |

* cited by examiner

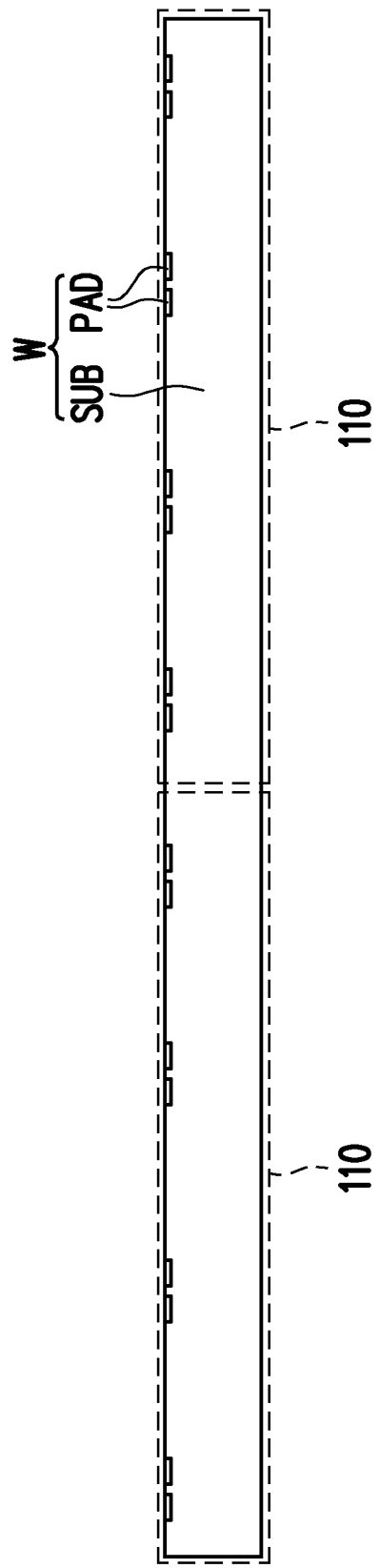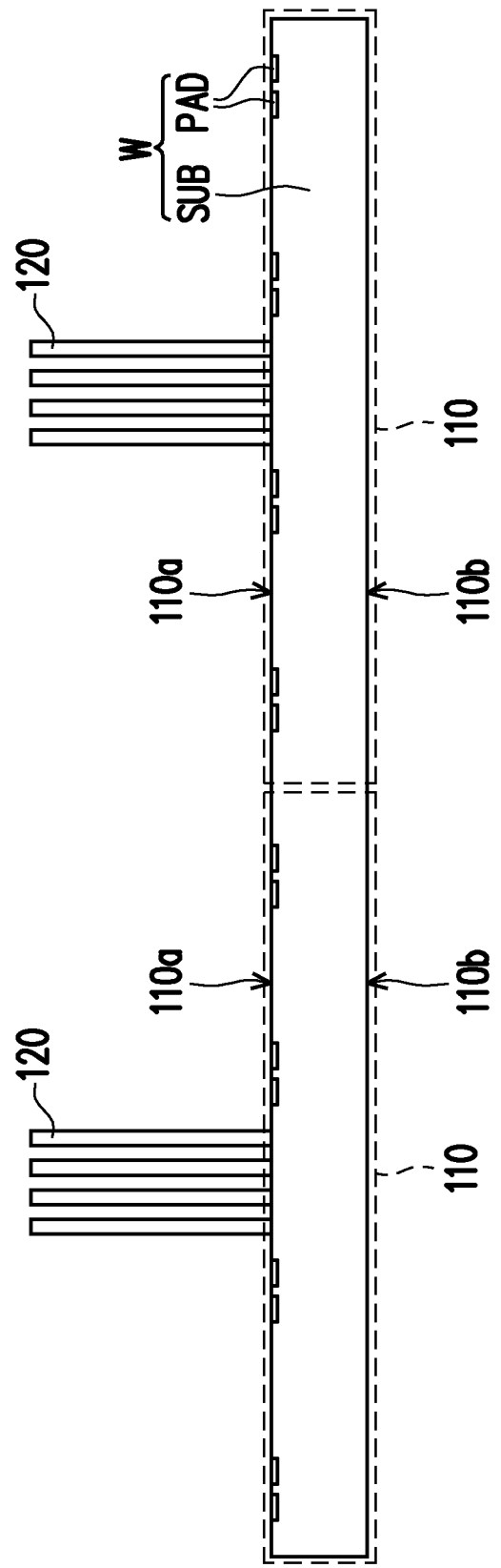

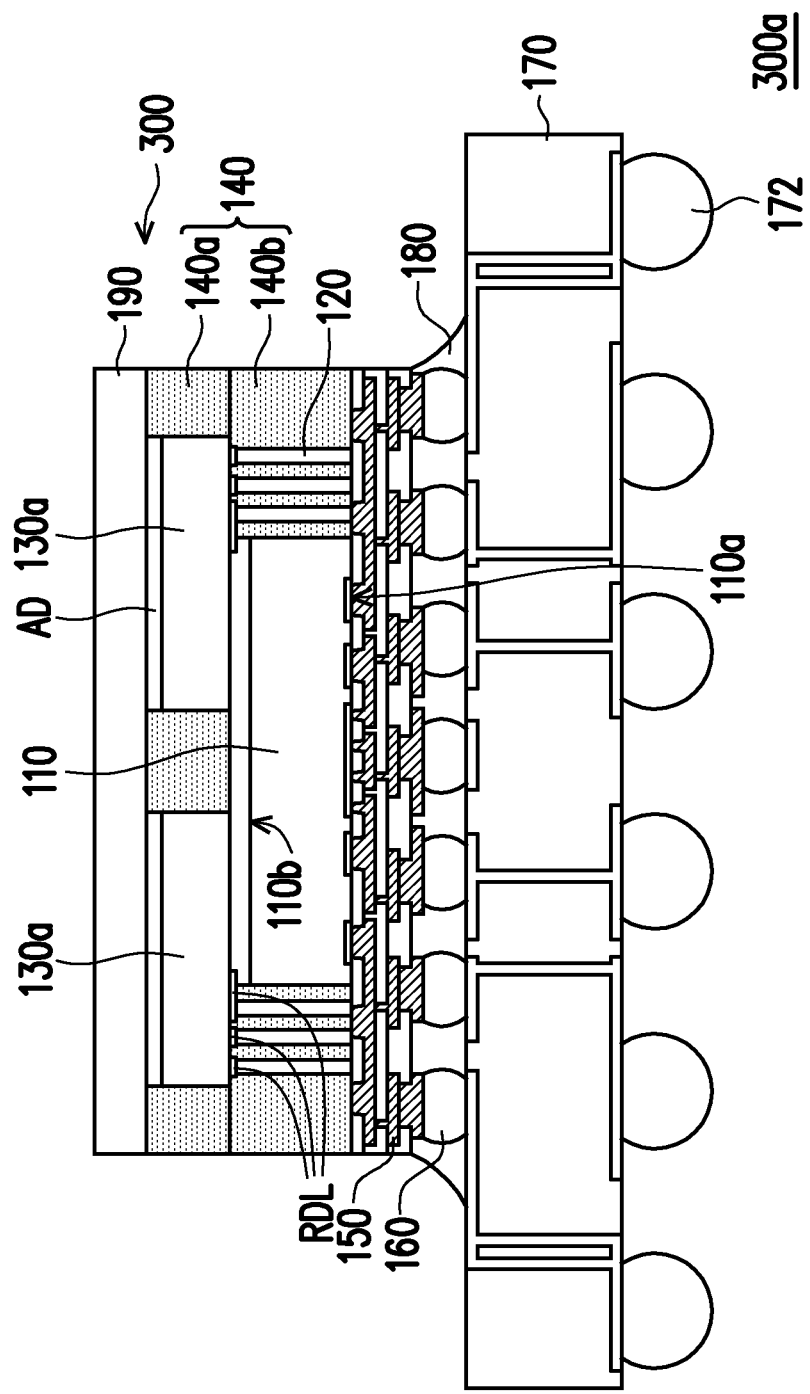

CHIP PACKAGE

CROSS-REFERENCE TO RELATED APPLICATION

This is a continuation application of and claims the priority benefit of U.S. application Ser. No. 16/542,284, filed on Aug. 15, 2019, now issued as U.S. Pat. No. 10/770,655, dated Sep. 8, 2020. The U.S. application Ser. No. 16/542,284 is a continuation application of and claims the priority benefit of a prior application Ser. No. 15/253,887, filed on Sep. 1, 2016, U.S. Pat. No. 10,431,738 dated Oct. 1, 2019. The application Ser. No. 15/253,887 claims the priority benefits of U.S. provisional application Ser. No. 62/354,117, filed on Jun. 24, 2016. The entirety of the above-mentioned patent applications is hereby incorporated by reference herein and made a part of this specification.

BACKGROUND

The semiconductor industry has experienced rapid growth due to continuous improvements in the integration density of various electronic components (i.e., transistors, diodes, resistors, capacitors, etc.). For the most part, this improvement in integration density has come from repeated reductions in minimum feature size, which allows more of the smaller components to be integrated into a given area. These smaller electronic components also require smaller packages that utilize less area than previous packages. Some smaller types of packages for semiconductor components include quad flat packages (QFPs), pin grid array (PGA) packages, ball grid array (BGA) packages, and so on.

Currently, integrated fan-out packages are becoming increasingly popular for their compactness to deliver merits of low power consumption, high performance, small package footprint, and competitive cost. How to enhance the performance of the integrated fan-out packages, particularly in the area of high density, high power applications, is an important goal of this patent focus.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 1 through 8 illustrate a process flow for fabricating integrated fan-out packages in accordance with some embodiments.

FIG. 28 is a cross-sectional view illustrating the integrated fan-out package in accordance with some alternative embodiments.

DETAILED DESCRIPTION

Figure 3:
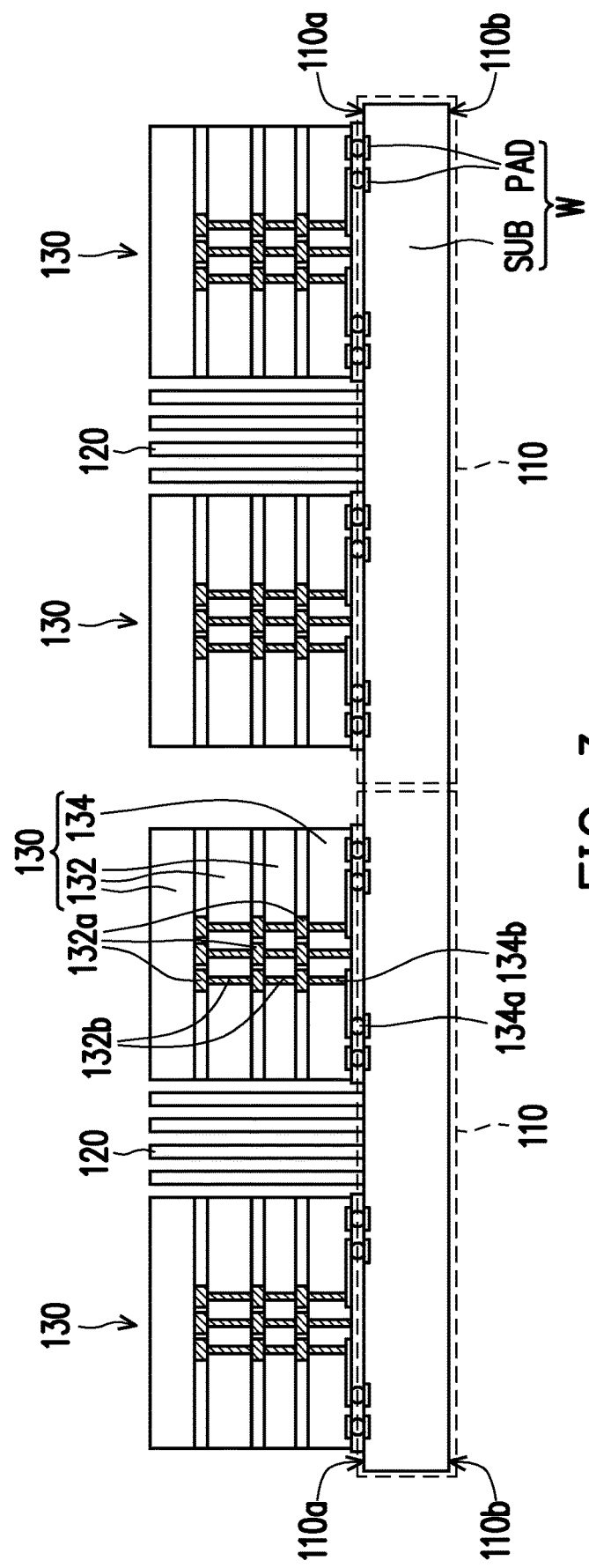

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIGS. 1 through 8 illustrate a process flow for fabricating integrated fan-out packages in accordance with some embodiments. Referring to FIG. 1, a wafer W including a plurality of integrated circuits 110 arranged in an array is provided. In some embodiments, the integrated circuits 110 may be system on chip (SOC) integrated circuits. Before a wafer dicing process is performed on the wafer W, the integrated circuits 110 in the wafer W are connected one another. In some embodiments, the wafer W includes a semiconductor substrate SUB, a plurality of conductive pads PAD formed on the semiconductor substrate SUB. For example, the semiconductor substrate SUB may be a silicon substrate including active components (e.g., transistors or the like) and passive components (e.g., resistors, capacitors, inductors or the like) formed therein; and the conductive pads PAD may be aluminum pads, copper pads or other suitable metallic pads.

In some embodiments, the wafer W may optionally include at least one passivation layer formed over the semiconductor substrate SUB. The passivation layer may have a plurality of contact openings, and the conductive pads PAD are exposed by the contact openings of the passivation. For example, the passivation layer may be a polyimide (PI) layer, a polybenzoxazole (PBO) layer, or other suitable dielectric materials.

Referring to FIG. 2, a plurality of conductive pillars 120 are formed on the wafer W such that the conductive pillars 120 are in contact with and thermally connected to the integrated circuits 110. Each of the integrated circuits 110 may include an active surface 110a and a rear surface 110b opposite to the active surface 110a. Parts of the conductive pillars 120 are in contact with and thermally connected to the active surfaces 110a of the integrated circuits 110, while the rests of the conductive pillars 120 are electrically connected to the conductive pads PAD of the integrated circuits 110. In other words, parts of the conductive pillars 120 are thermal conductive pillars for conducting the heat generated from the integrated circuits 110, while the rests of the conductive pillars 120 are electrically connected to the conductive pads PAD of the integrated circuits 110 for transmitting and receiving signal. In some alternative embodiments, all the conductive pillars 120 are electrically connected to the conductive pads PAD of the integrated circuits 110 for transmitting and receiving signal.

In some embodiments, the conductive pillars 120 are plated on the integrated circuits 110. The plating process for fabricating the conductive pillars 120 is described in detail as followings. First, a seed layer is sputtered onto the wafer W. A patterned photoresist layer (not shown) is then formed over the seed layer by photolithography, wherein the patterned photoresist layer exposes portions of the seed layer that are corresponding to the conductive pillars 120. The wafer W including the patterned photoresist layer formed thereon is then immersed into a plating solution contained in a plating bath such that the conductive pillars 120 are plated on the exposed portions of the seed layer. After the plated conductive pillars 120 are formed, the patterned photoresist layer is stripped. Thereafter, by using the conductive pillars 120 as a hard mask, portions of the seed layer that are not covered by the conductive pillars 120 are removed through etching until the active surfaces 110a of the integrated circuits 110 are exposed. The above-mentioned plating process for fabricating the conductive pillars 120 is merely for illustration. The disclosure is not limited thereto.

Referring to FIG. 3, a plurality of memory devices 130 are mounted onto the wafer W, and the memory devices 130 are electrically connected to the integrated circuits 110. The memory devices 130 are mounted onto the wafer W through flip-chip bonding and under-fill processes, for example. In some embodiments, each of the memory devices 130 may include a plurality of stacked memory chips 132 and a controller 134. Each of the memory chips 132 includes a plurality of micro-bumps 132a, and parts of the memory chips 132 include a plurality of through vias 132b (e.g. through silicon vias). The controller 134 includes a plurality of micro-bumps 134a and a plurality of through vias 134b (e.g. through silicon vias) electrically connected to the micro-bumps 134a. Through the micro-bumps 132a, the through vias 132b and the through vias 134b, the stacked memory chips 132 and the controller 134 are electrically connected. Through the micro-bumps 134a of the controllers 134, the memory devices 130 are capable of electrically connecting to the integrated circuits 110 in the wafer W. As shown in FIG. 3, no through via is required to be formed in the topmost one of the memory chips 132.

As shown in FIG. 3, the memory devices 130 are high bandwidth memory (HBM) cubes, for example. However, the HBM cubes are merely for illustration, and the disclosure is not limited thereto.

In some embodiments, the height of the conductive pillars 120 may be substantially equal to the thickness of the memory devices 130. In some alternative embodiments, the height of the conductive pillars 120 may be greater than the thickness of the memory devices 130.

As shown in FIG. 2 and FIG. 3, the conductive pillars 120 are formed before mounting the memory devices 130 onto the wafer W. However, the disclosure is not limited thereto. In some alternative embodiments, the conductive pillars 120 may be formed after mounting the memory devices 130 onto the wafer W.

Figure 4:
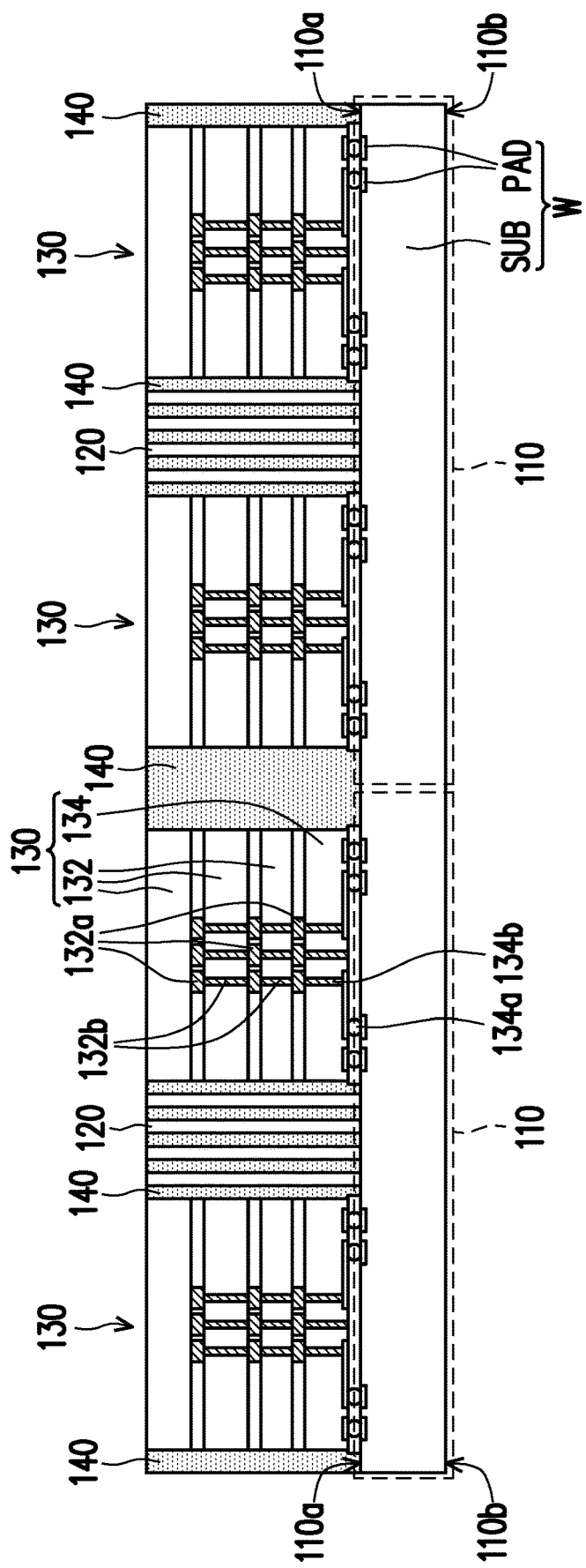

Referring to FIG. 4, an insulating encapsulation 140 is formed over the wafer W to encapsulate the memory devices 130 and the conductive pillars 120 such that the integrated circuits 110, the conductive pillars 120 and the memory devices 130 are embedded in the insulating encapsulation 140. In some embodiments, the insulating encapsulation 140 may be a molding compound formed by a molding process. The material of the insulating encapsulation 140 includes epoxy or other suitable dielectric materials.

The insulating encapsulation 140 may be formed by an over-mold process and a grinding process, for example. In some embodiments, an insulating material is formed on the wafer W to entirely cover the conductive pillars 120 and the memory devices 130 by the over-molding process, and the insulating material is then grinded by a mechanical grinding process and/or a chemical mechanical polishing (CMP) process until the top surfaces of the conductive pillars 120 and the top surfaces of the memory devices 130 are exposed. In some embodiments, the conductive pillars 120 and the top surfaces of the memory devices 130 are co-planar in the same level.

Figure 5:
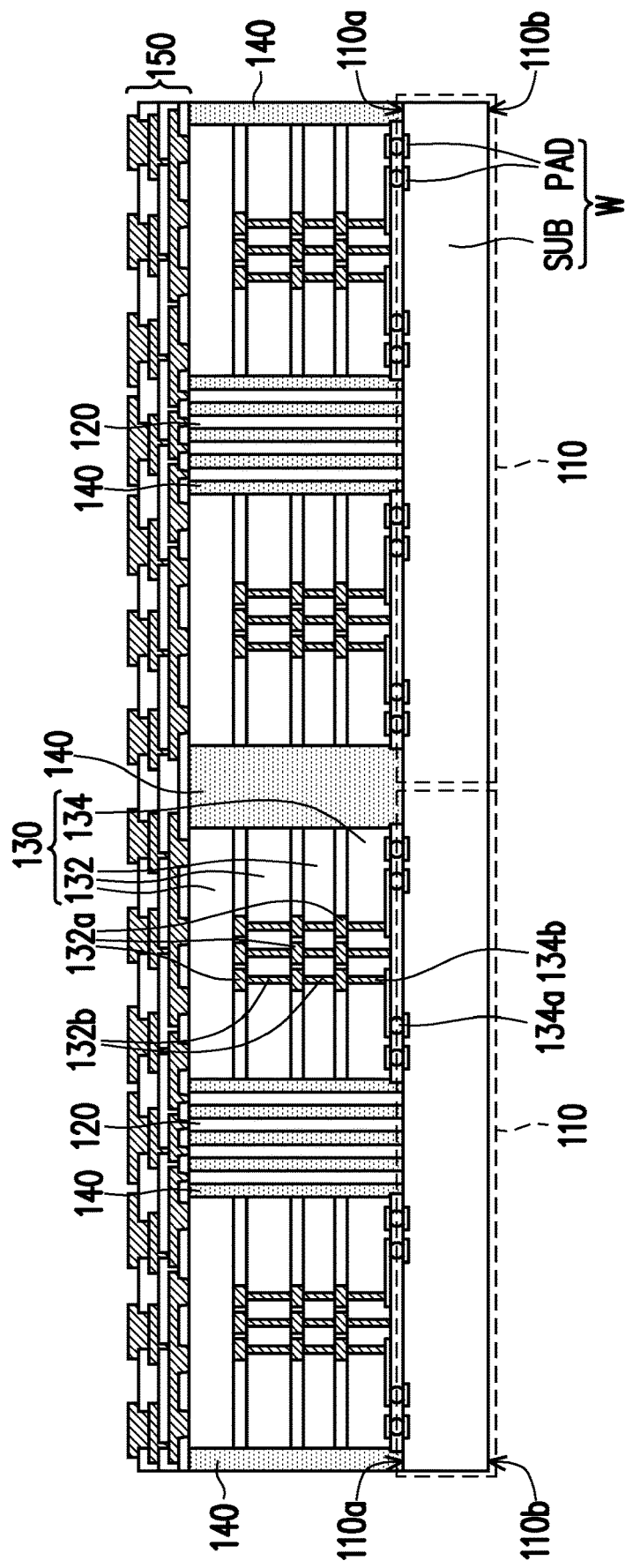

Referring to FIG. 5, after forming the insulating encapsulation 140, a redistribution circuit structure 150 is formed on the top surface of the insulating encapsulation 140, the top surfaces of the conductive pillars 120, and the top surfaces of the memory devices 130. In some embodiments, the redistribution circuit structure 150 is thermally connected to parts of the conductive pillars 120 which are thermally connected to the active surfaces 110a of the integrated circuits 110, and the redistribution circuit structure 150 is electrically connected to the rests of the conductive pillars 120 which are electrically connected to the conductive pads PAD of the integrated circuits 110. When parts of the conductive pillars 120 serve as thermal conductive pillars, the redistribution circuit structure 150 may include a plurality of thermal vias thermally connected to parts of the thermal conductive pillars 120. Through the thermal conductive pillars 120 and the thermal vias in the redistribution circuit structure 150, the heat generated from the integrated circuits 110 may be conducted and dissipated efficiently.

In some alternative embodiments, the redistribution circuit structure 150 is electrically connected to all the conductive pillars 120. Though all the conductive pillars 120 are used to transmit and receive signal, the conductive pillars 120 are capable of conducting the heat generated from the integrated circuits 110. When all the conductive pillars serve as signal conductive pillars, the redistribution circuit structure 150 may also include a plurality of thermal vias thermally connected to each or parts of the conductive pillars 120. Through the conductive pillars 120 and the thermal vias in the redistribution circuit structure 150, the heat generated from the integrated circuits 110 may be conducted and dissipated efficiently.

As shown in FIG. 5, the redistribution circuit structure 150 is electrically connected to the integrated circuits 110 and the memory devices 130 through the conductive pillars 120. In some embodiments, the redistribution circuit structure 150 is electrically connected to the memory devices 130 through the conductive pillars 120 and the circuit layers of the integrated circuits 110.

Figure 6:
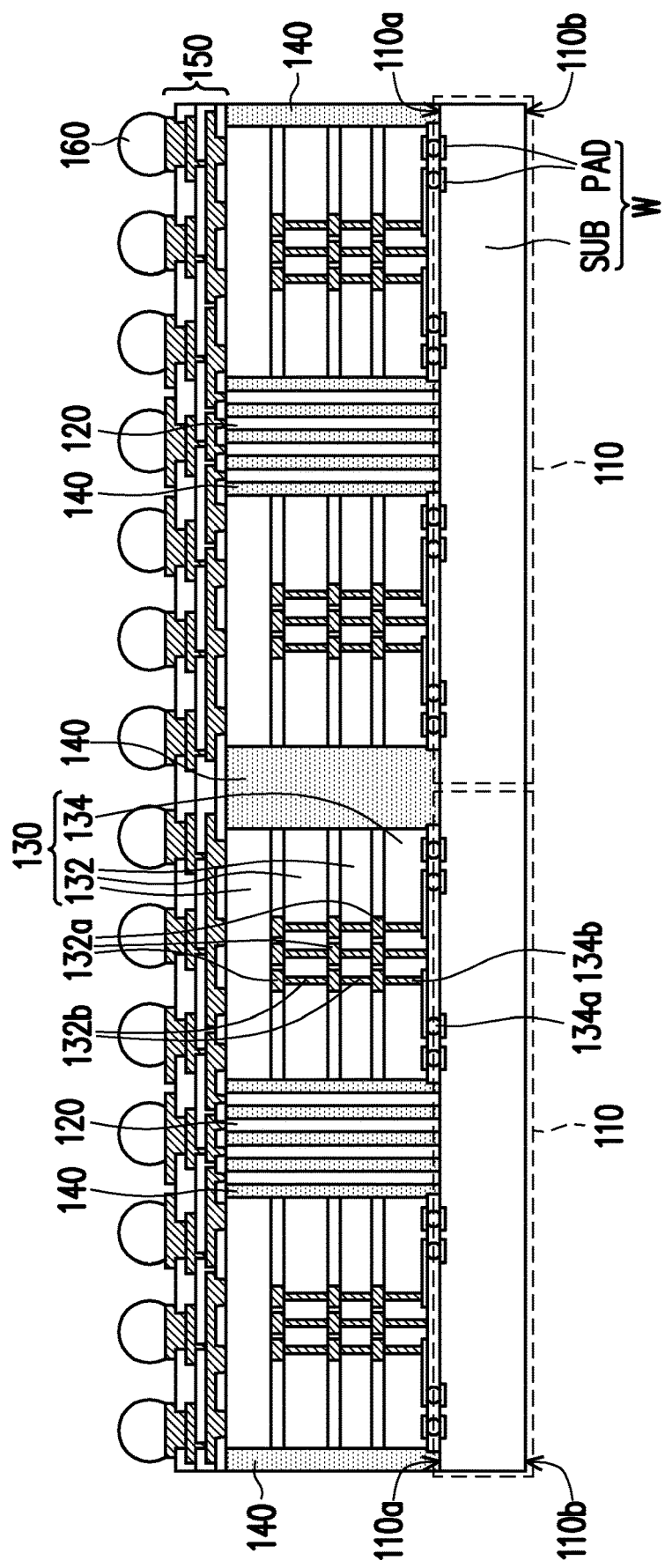

Referring to FIG. 6, after the redistribution circuit structure 150 is formed, a plurality of conductive terminals 160 which are electrically connected to the redistribution circuit structure 150 are formed. The redistribution circuit structure 150 is disposed between the conductive terminals 160 and the memory devices 130. In other words, the conductive terminals 160 are distributed at one side of the redistribution circuit structure 150, while the integrated circuits 110, the conductive pillars 120 and the memory devices 130 are distributed at the other side of the redistribution circuit structure 150. In some embodiments, the conductive terminals 160 may be conductive bumps or conductive balls.

Figure 7:
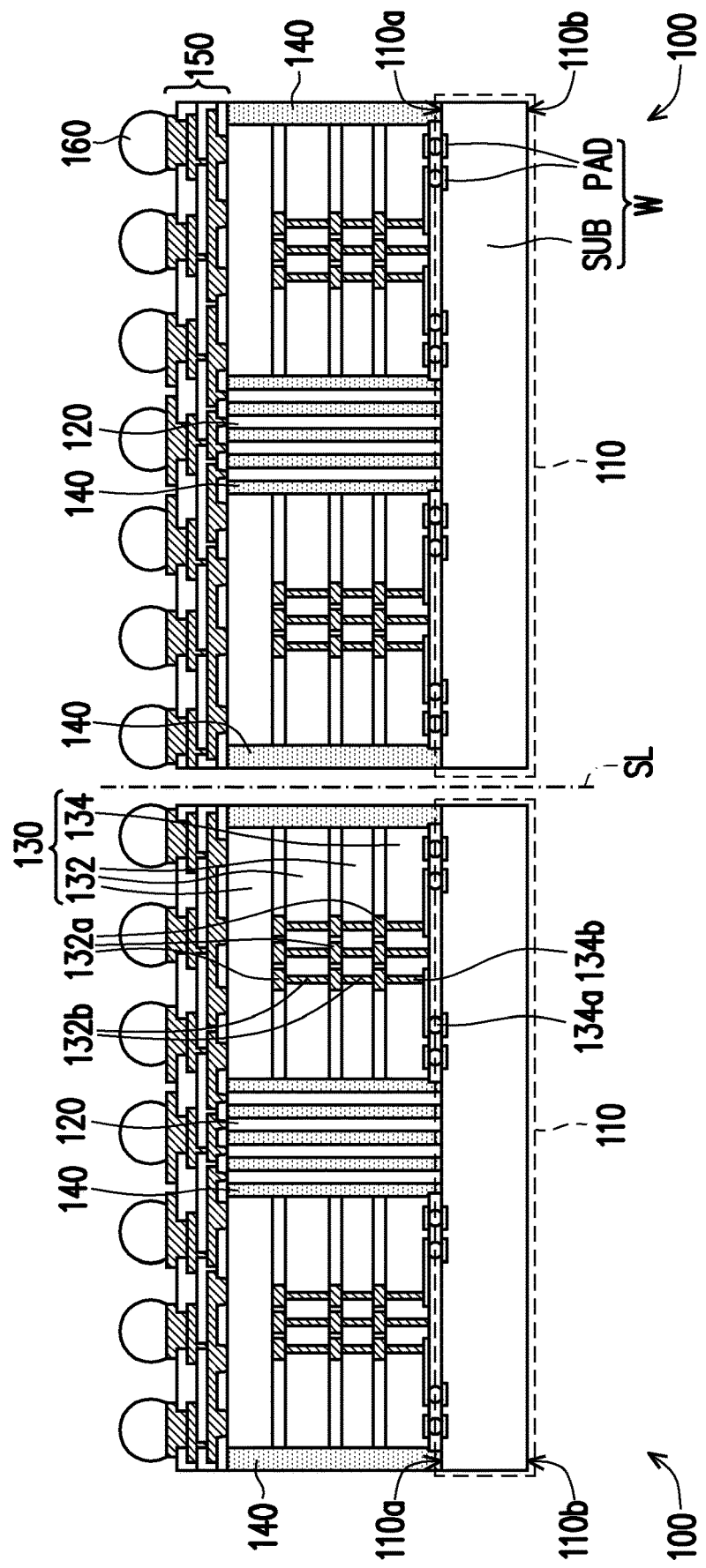

Referring to FIG. 6 and FIG. 7, a wafer dicing process is performed along the scribe line SL to singulate the resulted structure shown in FIG. 6 so as to form a plurality of singulated packages 100. During the dicing process, the redistribution circuit structure 150, the insulating encapsulation 140 and the wafer W are sawed to form the singulated packages 100.

As shown in FIG. 7, the integrated circuit 110, the memory devices 130, the insulating encapsulation 140, and the redistribution circuit structure 150 are included in the integrated fan-out package 100. The memory devices 130 are electrically connected to the integrated circuit 110. The integrated circuit 110 and the memory devices 130 are stacked, and the memory devices 130 are embedded in the insulating encapsulation 140. The redistribution circuit structure 150 is disposed on the insulating encapsulation 140, and the redistribution circuit structure 150 is electrically connected to the integrated circuit 110 and the memory devices 130. In some embodiments, the conductive terminals 160 may be formed optionally.

As shown in FIG. 7, the integrated circuit 110 in the integrated fan-out package 100 is not embedded in the insulating encapsulation 140, and the memory devices 130 are disposed between the redistribution circuit structure 150 and the integrated circuit 110.

Figure 8:
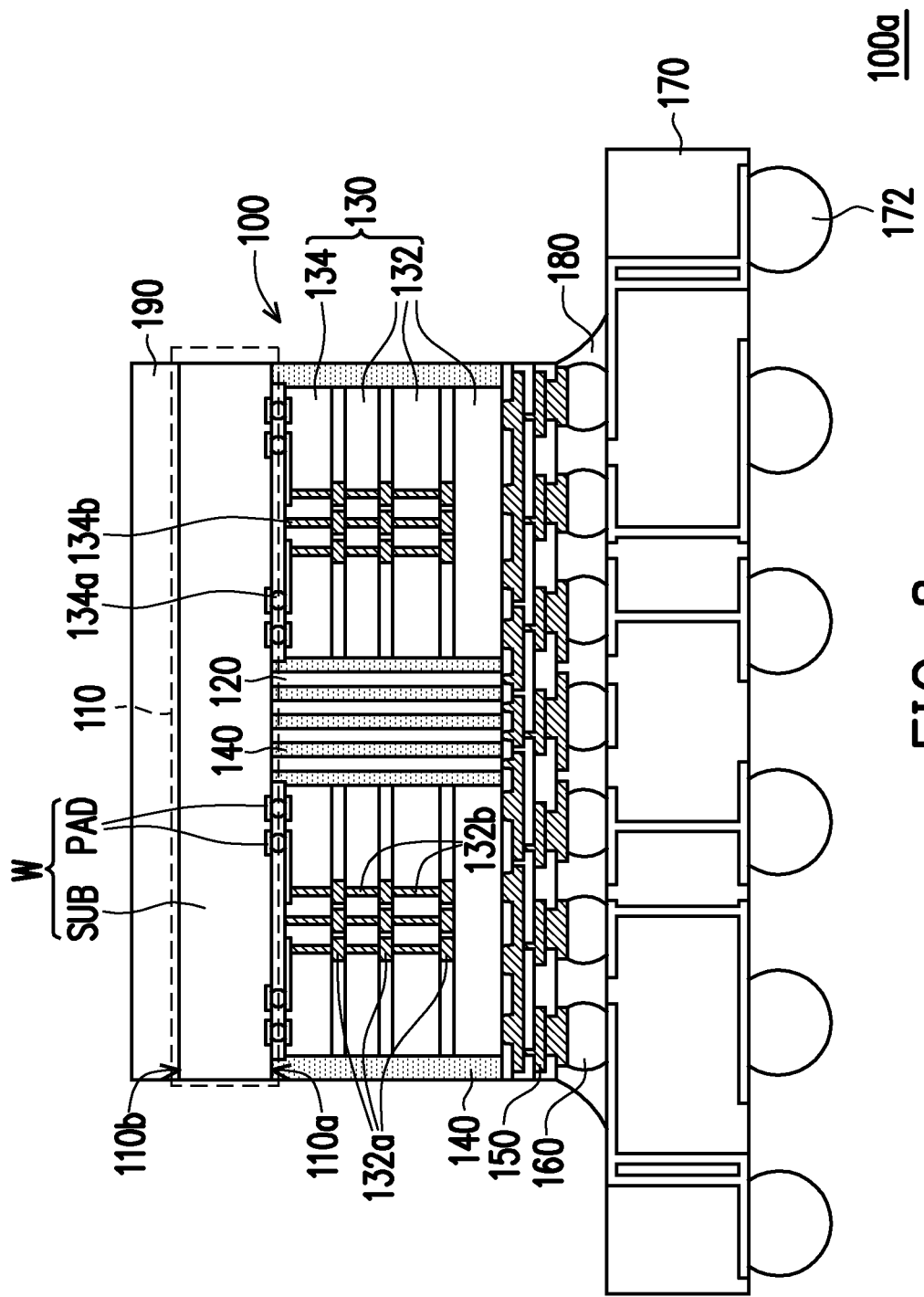

Referring to FIG. 8, after the singulated packages 100 are formed, one of the singulated packages 100 may be picked-up and mounted onto a package circuit substrate 170. The redistribution circuit structure 150 in the singulated package 100 is electrically connected to the package circuit substrate 170 through the conductive terminals 160. In some embodiments, the package circuit substrate 170 may include a plurality of conductive balls 172 distributed on the bottom surface thereof. For example, the conductive balls 172 may be solder balls or other metal balls. It is noted that the arranging pitch between the conductive terminals 160 is less than the arranging pitch between the conductive balls 172, for example. In other words, the package circuit substrate 170 having the conductive balls 172 distributed thereon may be a ball-grid array (BGA) circuit board, and a ball-grid array (BGA) package 100a including the singulated packages 100 and the package circuit substrate 170 is accomplished.

As shown in FIG. 8, to enhance the bonding reliability of the conductive terminals 160, an under fill 180 may be filled between the redistribution circuit structure 150 and the package circuit substrate 170. The under fill 180 encapsulates the conductive terminals 160 to secure the structural integrity of the conductive terminals 160 and its bonding interfaces at the redistribution circuit structure 150 due to the coefficient of thermal expansion (CTE) mismatch between the redistribution circuit structure 150 and the package circuit substrate 170. In other words, the shearing stress resulted from CTE mismatch may be absorbed by the under fill 180, and the conductive terminals 160 can be protected by the under fill 180.

In some embodiments, to further enhance the thermal dissipation capability, a heat spreader 190 may be adhered on the rear surface 110b of the integrated circuit 100. For example, the material of the heat spreader 190 may include aluminum or other suitable metallic materials.

Figure 9:
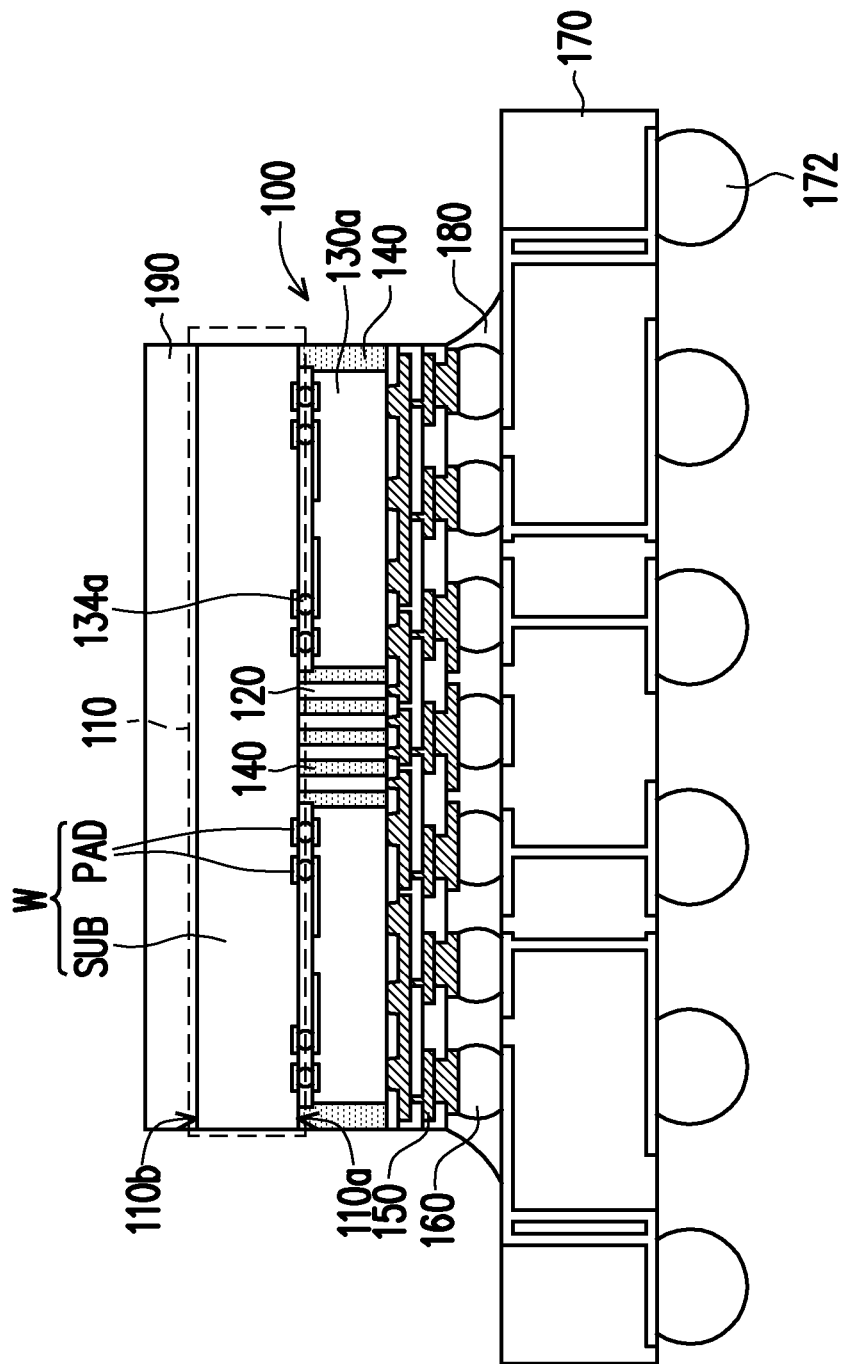
FIG. 9 is a cross-sectional view illustrating the integrated fan-out package in accordance with some alternative embodiments.

FIG. 9 is a cross-sectional view illustrating the integrated fan-out package in accordance with some alternative embodiments. Referring to FIG. 9, instead of high bandwidth memory (HBM) cubes, memory devices 130a having architectures which are different from the memory devices 130 (shown in FIG. 3) may be used. It is noted that the number of the memory devices 130a is not limited in this disclosure.

FIGS. 10 through 17 illustrate a process flow for fabricating another integrated fan-out package in accordance with some embodiments.

Figure 10:
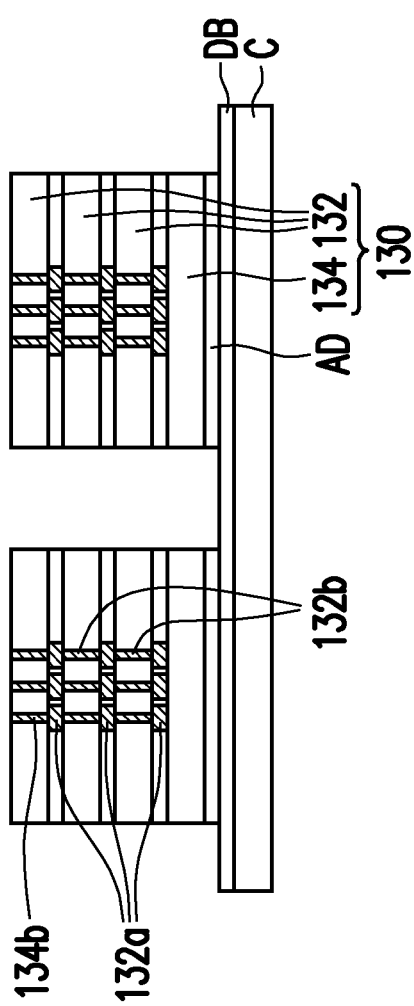
FIGS. 10 through 17 illustrate a process flow for fabricating another integrated fan-out package in accordance with some embodiments.

Referring to FIG. 10, a carrier C including a de-bonding layer DB formed thereon is provided. In some embodiments, the carrier C is a glass substrate, and the de-bonding layer DB is a light-to-heat conversion (LTHC) release layer formed on the glass substrate, for example. The materials of the carrier C and the de-bonding layer DB are not limited in this disclosure.

After the carrier C having a de-bonding layer DB formed thereon is provided, a plurality of memory devices 130 are mounted onto the de-bonding layer DB and the carrier C through an adhesive AD. The Die-attachment film (DAF) used in the die-bond process may serves as the adhesive AD, for example. In some embodiments, each of the memory devices 130 may include a plurality of stacked memory chips 132 and a controller 134. Each of the memory chips 132 includes a plurality of micro-bumps 132a, and parts of the memory chips 132 include a plurality of through vias 132b (e.g. through silicon vias). The controller 134 includes a plurality of through vias 134b electrically connected to the micro-bumps 132a of the memory chips 132. Through the micro-bumps 132a, the through vias 132b, and the through vias 134b, the stacked memory chips 132 and the controller 134 are electrically connected. As shown in FIG. 10, no through via is required to be formed in the bottommost one of the memory chips 132, and the controller 134 is stacked over the memory chips 132.

As shown in FIG. 10, the memory devices 130 are high bandwidth memory (HBM) cubes, for example. However, the HBM cubes are merely for illustration, and the disclosure is not limited thereto.

Figure 11:
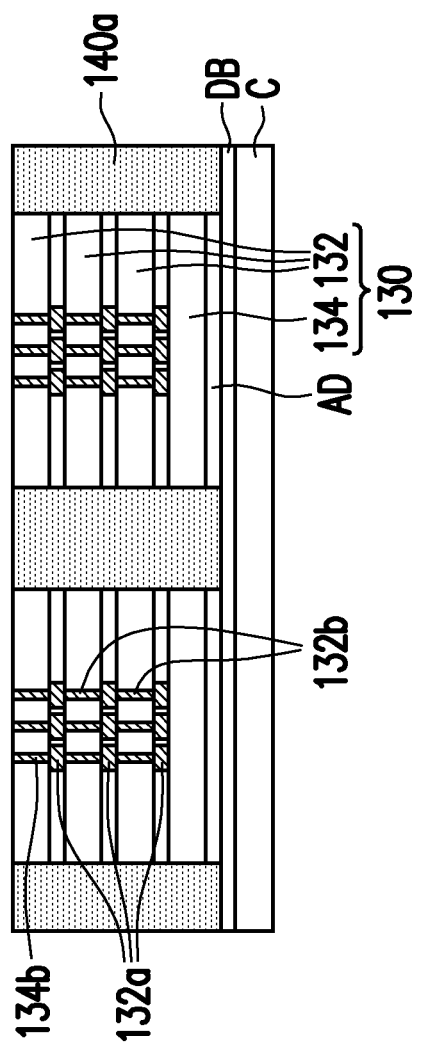

Referring to FIG. 11, a first insulating portion 140a is formed over the de-bonding layer DB and the carrier C to encapsulate and the memory devices 130 such that the memory devices 130 are embedded in the first insulating portion 140a. In some embodiments, the first insulating portion 140a may be a molding compound formed by a molding process. The material of the first insulating portion 140a includes epoxy or other suitable dielectric materials.

The first insulating portion 140a may be formed by an over-mold process and a grinding process, for example. In some embodiments, an insulating material is formed on the carrier C and the de-bonding layer DB to entirely cover the memory devices 130 by the over-molding process, and the insulating material is then grinded by a mechanical grinding process and/or a chemical mechanical polishing (CMP) process until the top surfaces of the memory devices 130 are exposed.

Figure 12:
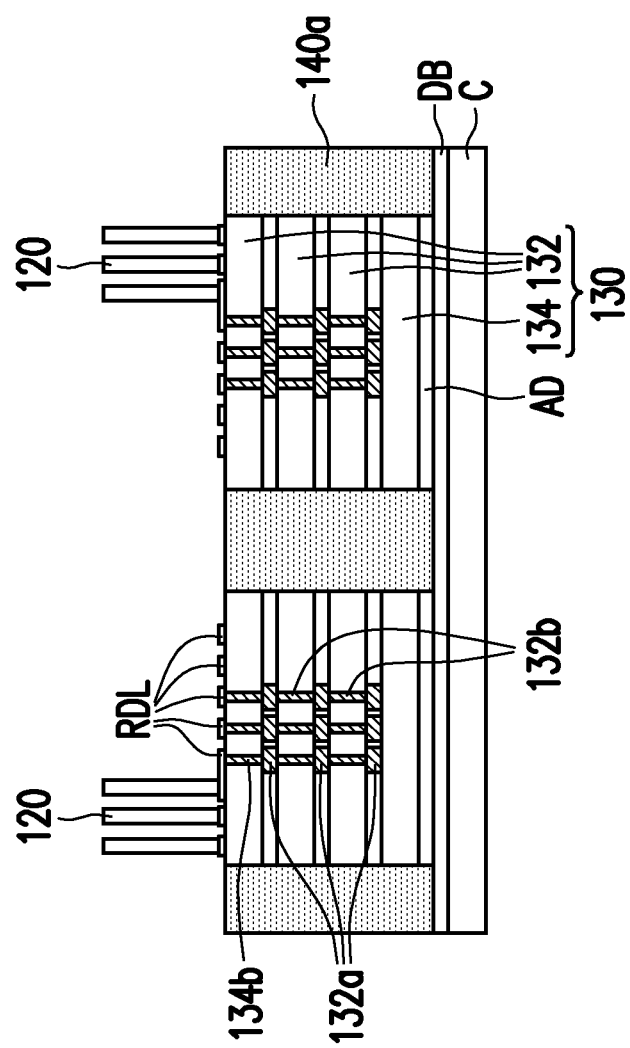

Referring to FIG. 12, a plurality of conductive pillars 120 are formed on the memory devices 130 and/or the first insulating portion 140a. In some embodiments, before the formation of the conductive pillars 120, a redistribution layer RDL is formed on the top surfaces of the memory devices 130 and/or the top surface of the first insulating portion 140a. The conductive pillars 120 are electrically connected to the memory devices 130 through the redistribution layer RDL, for example.

In some embodiments, the conductive pillars 120 are formed by a plating process. The plating process of conductive pillars 120 is described in detail as followings. First, a seed layer is sputtered onto the top surfaces of the memory devices 130 and the top surface of the first insulating portion 140a. A patterned photoresist layer (not shown) is then formed over the seed layer by photolithography, wherein the patterned photoresist layer exposes portions of the seed layer that are corresponding to the conductive pillars 120. Then, a plating process is performed to form the conductive pillars 120 on the exposed portions of the seed layer. After the plated conductive pillars 120 are formed, the patterned photoresist layer is stripped. Thereafter, by using the conductive pillars 120 as a hard mask, portions of the seed layer that are not covered by the conductive pillars 120 are removed through etching until the top surfaces of the memory devices 130 and the top surface of the first insulating portion 140a are exposed. The above-mentioned plating process of fabricating the conductive pillars 120 is merely for illustration. The disclosure is not limited thereto.

Figure 13:
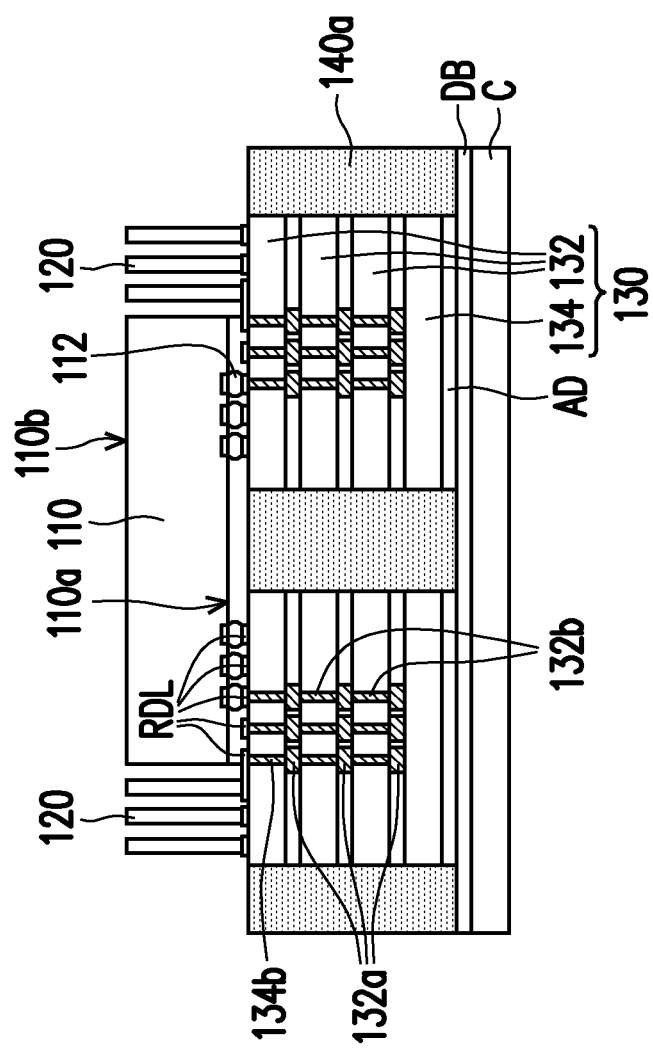

Referring to FIG. 13, after forming the conductive pillars 120, an integrated circuit 110 is picked-up and mounted onto the memory devices 130 and the first insulating portion 140a. The integrated circuit 110 is mounted onto the memory devices 130 through flip-chip bonding and underfill processes, for example. The integrated circuit 110 includes an active surface 110a and a rear surface 110b opposite to the active surface 110a, the active surface 110a of the integrated circuit 110 faces the memory devices 130, and the integrated circuit 110 is electrically connected to the memory devices 130 through a plurality of bumps 112 between the active surface 110a and the memory devices 130. In some embodiments, the integrated circuit 110 is electrically connected to the memory devices 130 through the redistribution layer RDL which is between the integrated circuit 110 and the memory devices 130. In some alternative embodiments, the integrated circuit 110 may be electrically connected to the memory devices 130 directly, and the integrated circuit 110 may be electrically connected to the conductive pillars 120 through the redistribution layer RDL. Electrical connection between the integrated circuit 110, the conductive pillars 120 and the memory devices 130 may be modified in accordance with design requirements, the disclosure is not limited thereto.

Figure 14:
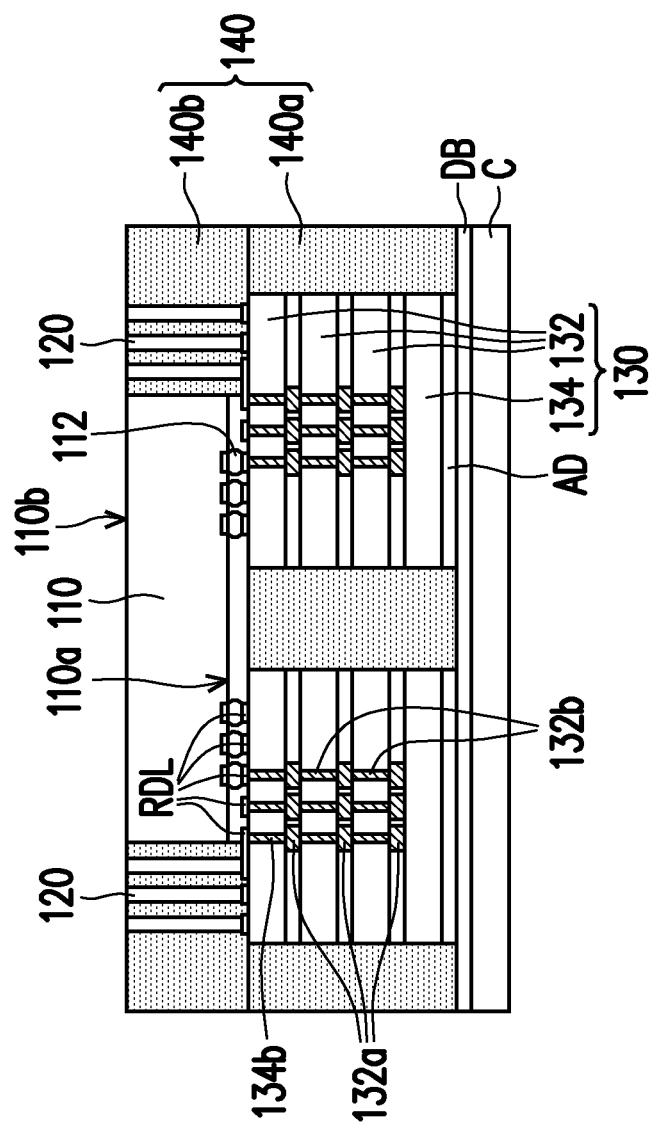

Referring to FIG. 14, a second insulating portion 140b is formed over the first insulating portion 140a to encapsulate the integrated circuit 110 and the conductive pillars 120. In some embodiments, the second insulating portion 140b may be a molding compound formed by a molding process. The material of the second insulating portion 140b includes epoxy or other suitable dielectric materials. The material of the first insulating portion 140a may be the same as that of the second insulating portion 140b, for example.

The second insulating portion 140b may be formed by an over-mold process and a grinding process, for example. In some embodiments, an insulating material is formed to encapsulate the integrated circuit 110 and the conductive pillars 120 by the over-molding process, and the insulating material is then grinded by a mechanical grinding process and/or a chemical mechanical polishing (CMP) process until the rear surface 110b of the integrated circuit 110 and the top surfaces of the conductive pillars 120 are exposed. During the grinding process of the second insulating portion 140b, the integrated circuit 110 and the conductive pillars 120 may be grinded to the same level.

The first insulating portion 140a and the second insulating portion 140b constitute the insulation encapsulation 140. As shown in FIG. 14, the integrated circuit 110, the conductive pillars 120 and the memory devices 130 are embedded in the insulation encapsulation 140.

In some embodiments, the height of the conductive pillars 120 may be substantially equal to the thickness of the integrated circuit 110 and the thickness of the second insulating portion 140b.

Figure 15:
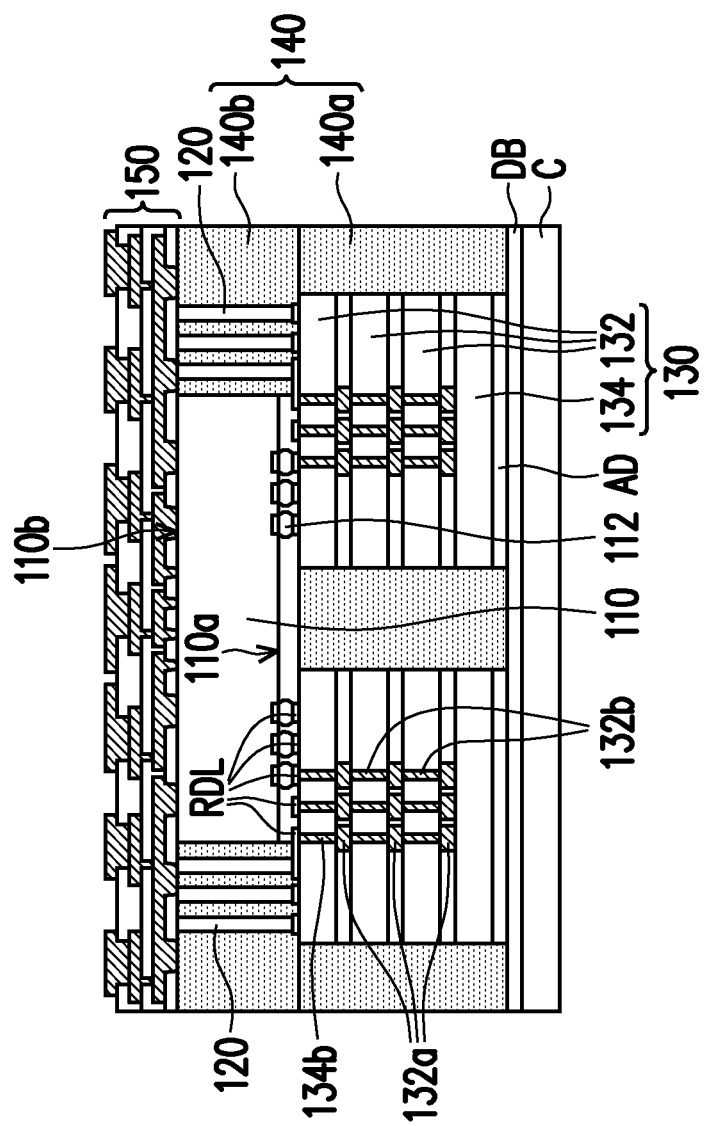

Referring to FIG. 15, after forming the insulating encapsulation 140, a redistribution circuit structure 150 is formed on the top surface of the insulating encapsulation 140, the top surfaces of the conductive pillars 120 and the rear surface 110b of the integrated circuit 110. In some embodiments, the conductive pillars 120 are electrically connected to the memory devices 130 and the redistribution circuit structure 150. In other words, the redistribution circuit structure 150 is electrically connected to the integrated circuit 110 and the memory devices 130 through the conductive pillars 120 and the redistribution layer RDL.

In some embodiments, the redistribution circuit structure 150 may include a plurality of thermal vias thermally connected to the rear surface 110b of the integrated circuit 110. Through the thermal vias in the redistribution circuit structure 150, the heat generated from the integrated circuit 110 may be conducted and dissipated efficiently.

Figure 16:
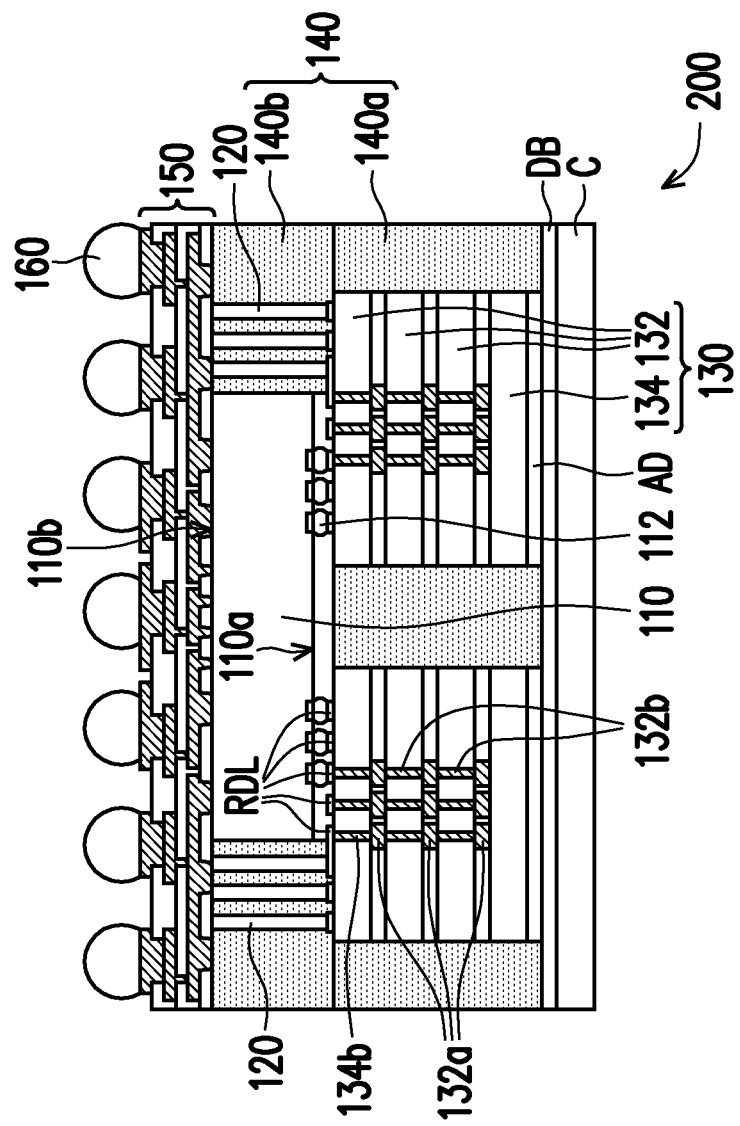

Referring to FIG. 16, after the redistribution circuit structure 150 is formed, a plurality of conductive terminals 160 which are electrically connected to the redistribution circuit structure 150 are formed. The integrated circuit 110 is disposed between the redistribution circuit structure 150 and the memory devices 130. In other words, the conductive terminals 160 are distributed at one side of the redistribution circuit structure 150, while the integrated circuit 110, the conductive pillars 120 and the memory devices 130 are distributed at the other side of the redistribution circuit structure 150. In some embodiments, the conductive terminals 160 may be conductive bumps or conductive balls.

As shown in FIG. 16, the integrated circuit 110, the memory devices 130, the insulating encapsulation 140, and the redistribution circuit structure 150 are included in the integrated fan-out package 200. The memory devices 130 are electrically connected to the integrated circuit 110. The redistribution circuit structure 150 is disposed on the insulating encapsulation 140, and the redistribution circuit structure 150 is electrically connected to the integrated circuit 110 and the memory devices 130. In some embodiments, the conductive terminals 160 may be optionally formed. As shown in FIG. 16, in the integrated fan-out package 200, the integrated circuit 110 and the memory devices 130 are embedded in the insulating encapsulation 140.

Figure 17:
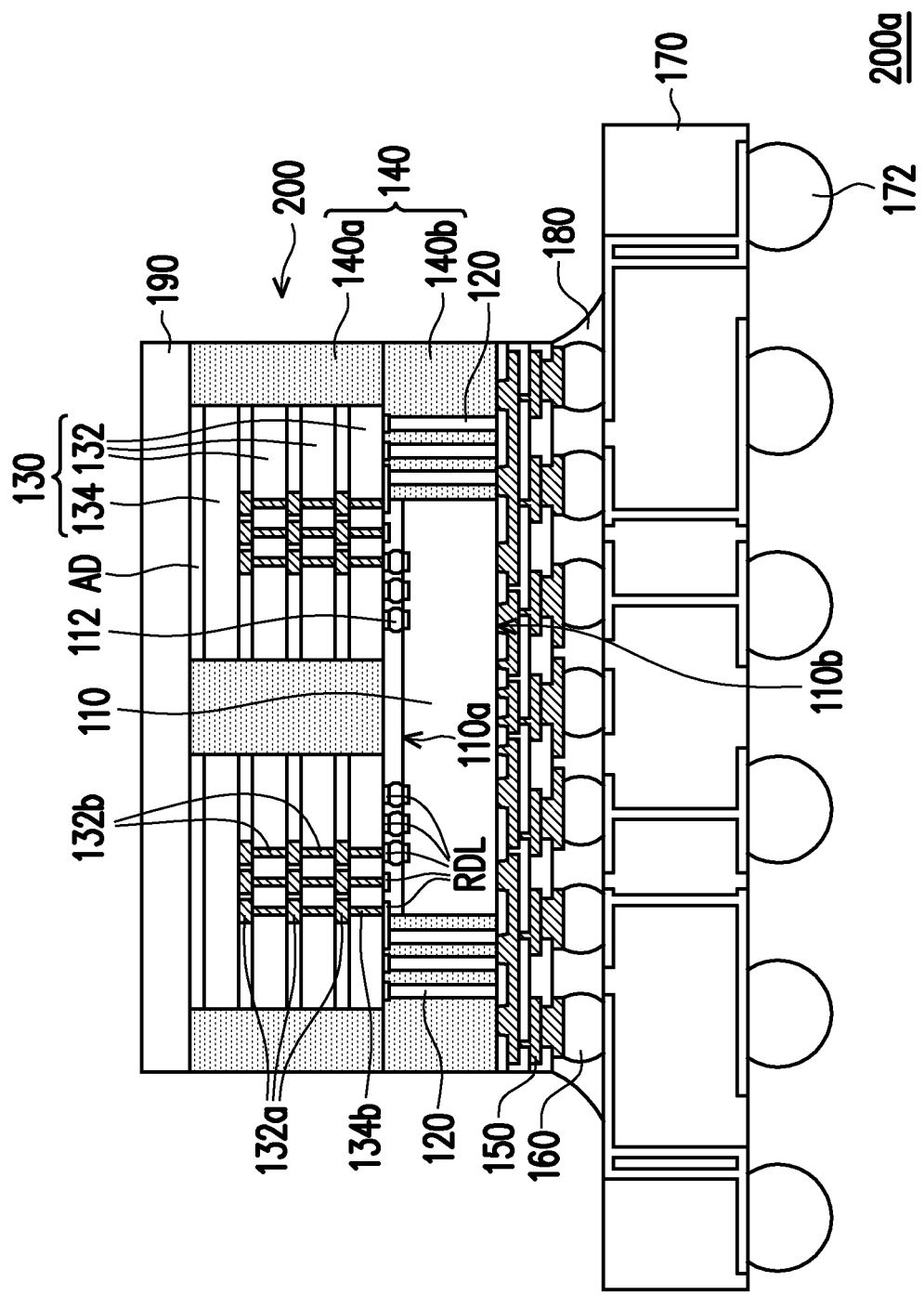

Referring to FIG. 17, the integrated fan-out package 200 is de-bonded from the de-bonding layer DB and the carrier C. In some embodiments, the de-bonding layer DB (e.g., the LTHC release layer) may be irradiated by an UV laser such that the integrated fan-out package 200 is separated from the de-bonding layer DB and the carrier C. The integrated fan-out package 200 may be picked-up and mounted onto a package circuit substrate 170. The redistribution circuit structure 150 in the integrated fan-out package 200 is electrically connected to the package circuit substrate 170 through the conductive terminals 160. In some embodiments, the package circuit substrate 170 may include a plurality of conductive balls 172 distributed on the bottom surface thereof. For example, the conductive balls 172 may be solder balls or other metal balls. It is noted that the arranging pitch between the conductive terminals 160 is less than the arranging pitch between the conductive balls 172. In other words, the package circuit substrate 170 having the conductive balls 172 distributed thereon may be a ball-grid array (BGA) circuit board, and a ball-grid array (BGA)

package 200a including the integrated fan-out package 200 and the package circuit substrate 170 is accomplished.

As shown in FIG. 17, to enhance the bonding reliability of the conductive terminals 160, an under fill 180 may be filled between the redistribution circuit structure 150 and the package circuit substrate 170. The under fill 180 encapsulates the conductive terminals 160 to secure the structural integrity of the conductive terminals 160 and its bonding interfaces at the redistribution circuit structure 150 due to the coefficient of thermal expansion (CTE) mismatch between the redistribution circuit structure 150 and the package circuit substrate 170. In other words, the shearing stress resulted from CTE mismatch may be absorbed by the under fill 180, and the conductive terminals 160 can be protected by the under fill 180.

In some embodiments, to further enhance the thermal dissipation capability, a heat spreader 190 may be adhered on the exposed surfaces of the memory devices 130 and the top surface of the insulating encapsulation 140. For example, the material of the heat spreader 190 may include aluminum or other suitable metallic materials.

Figure 18:
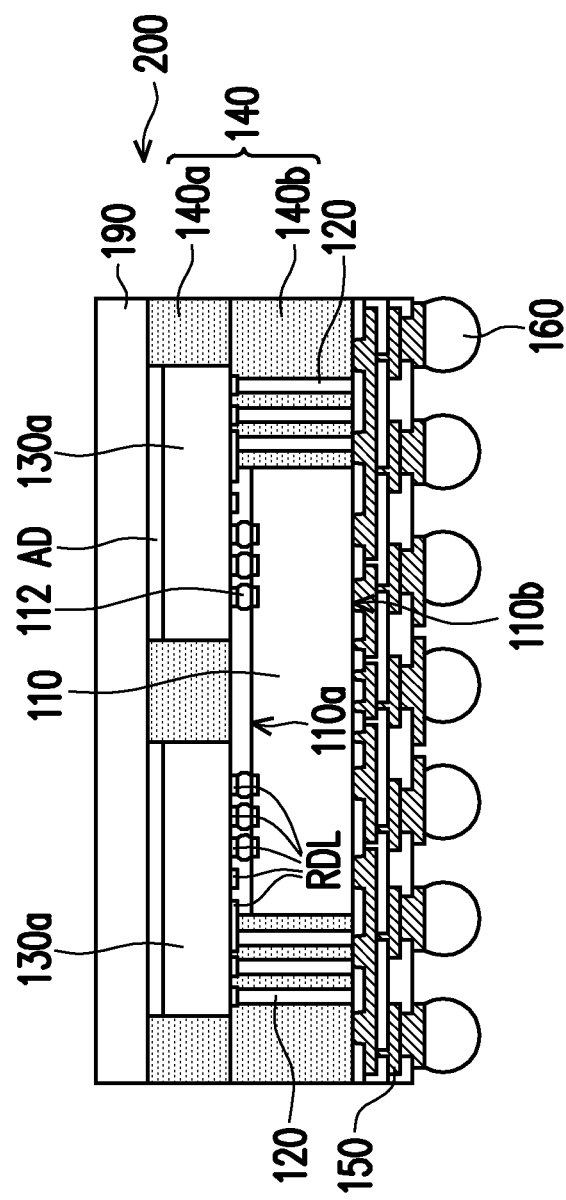
FIG. 18 and FIG. 19 are cross-sectional views illustrating the integrated fan-out package in accordance with some alternative embodiments.
Figure 19:
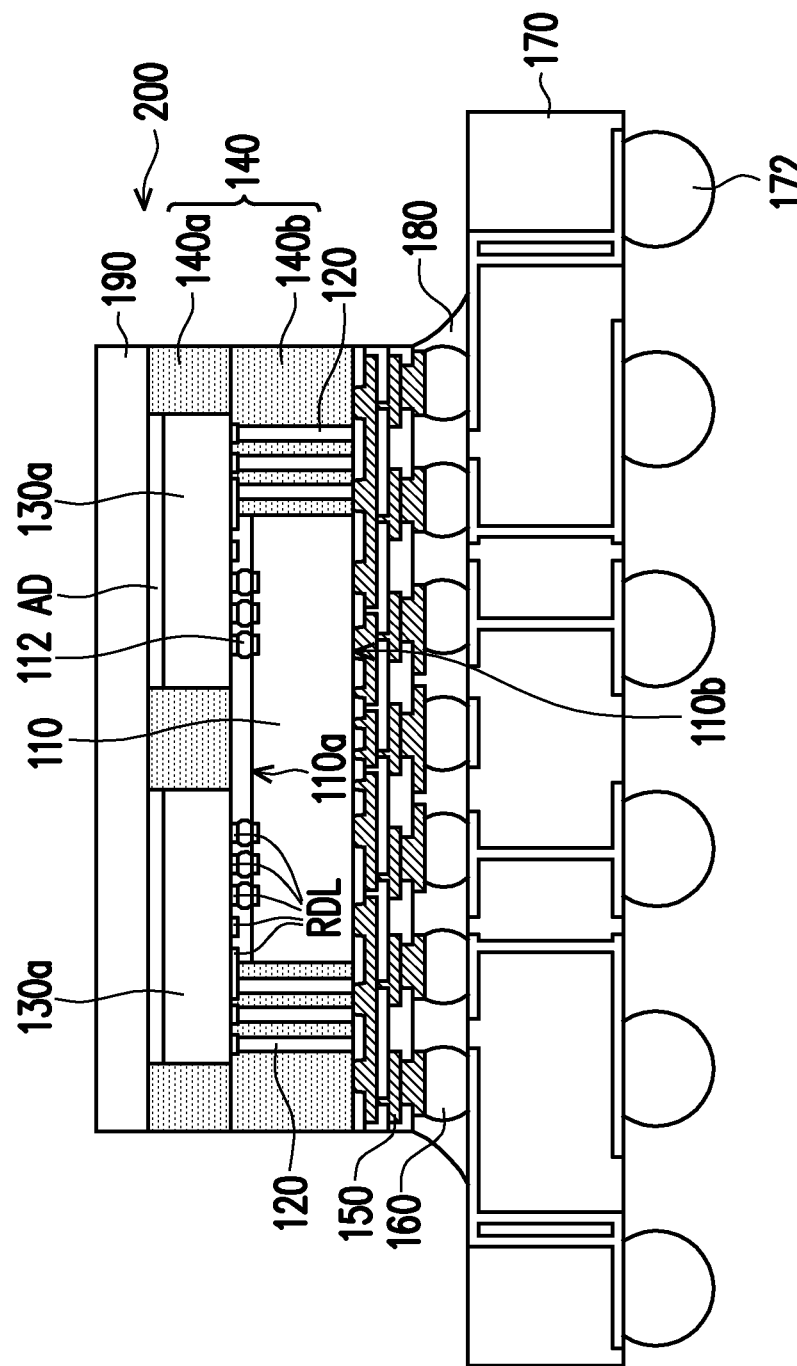

FIG. 18 and FIG. 19 are cross-sectional views illustrating the integrated fan-out package in accordance with some alternative embodiments. Referring to FIGS. 18 and 19, instead of high bandwidth memory (HBM) cubes, memory devices 130a having architectures which are different from the memory devices 130 (shown in FIG. 17) may be used. It is noted that the number of the memory devices 130a is not limited in this disclosure. Furthermore, the package circuit substrate 170 shown in FIG. 19 is optional in the integrated fan-out package, as shown in FIG. 18.

Figure 20:
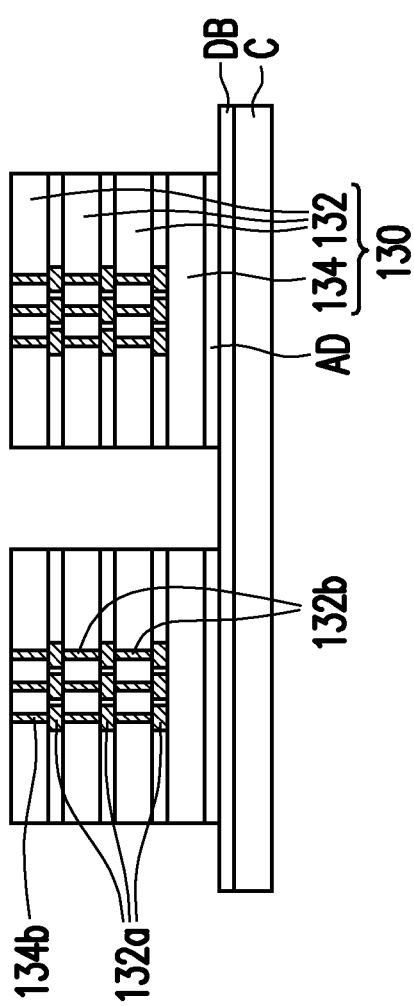
FIGS. 20 through 27 illustrate a process flow for fabricating yet another integrated fan-out package in accordance with some embodiments.
Figure 21:
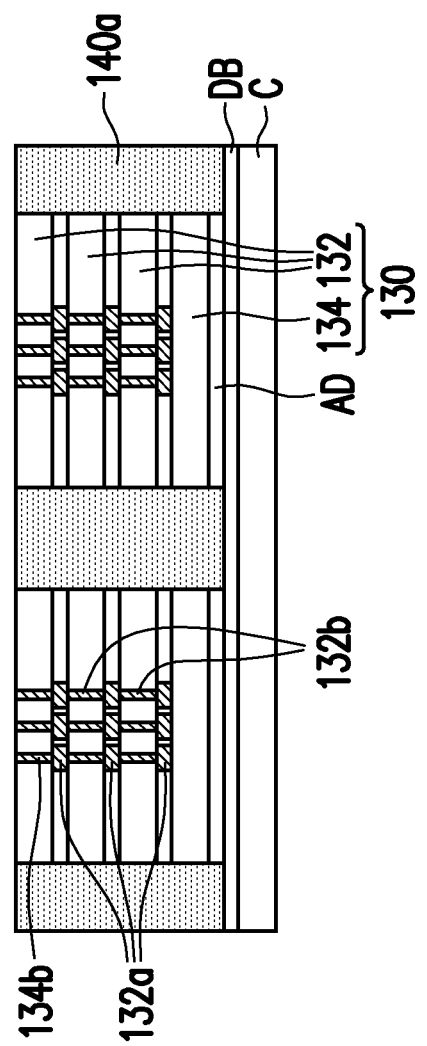
Figure 22:
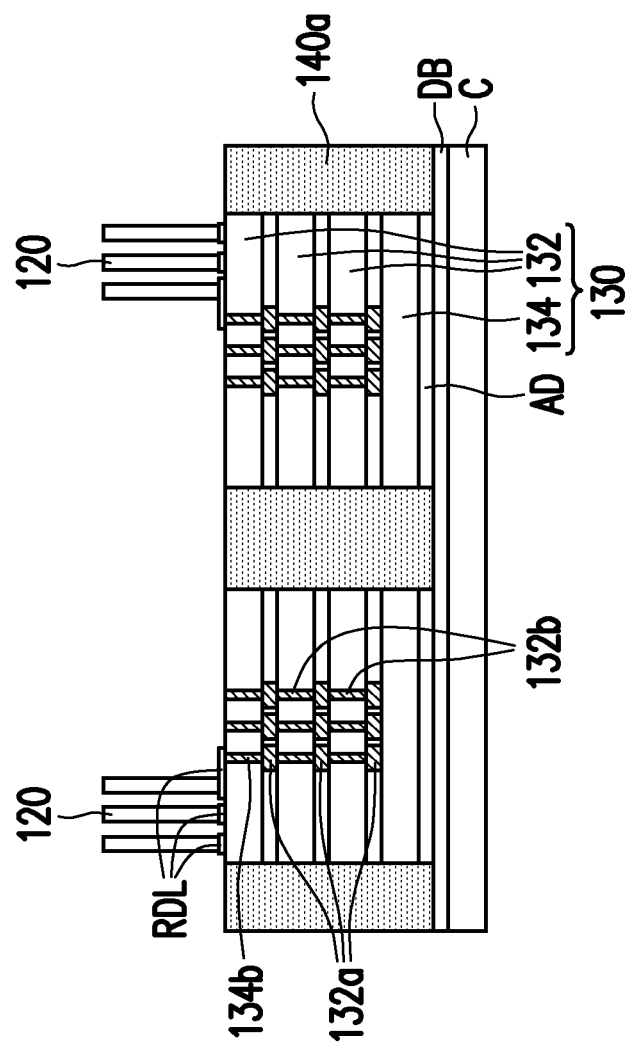

FIGS. 20 through 27 illustrate a process flow for fabricating yet another integrated fan-out package in accordance with some embodiments. Referring to FIGS. 20-22, the processes illustrated in FIGS. 20-22 are similar with those illustrated in FIGS. 10-12, and the detailed descriptions are thus omitted.

Figure 23:
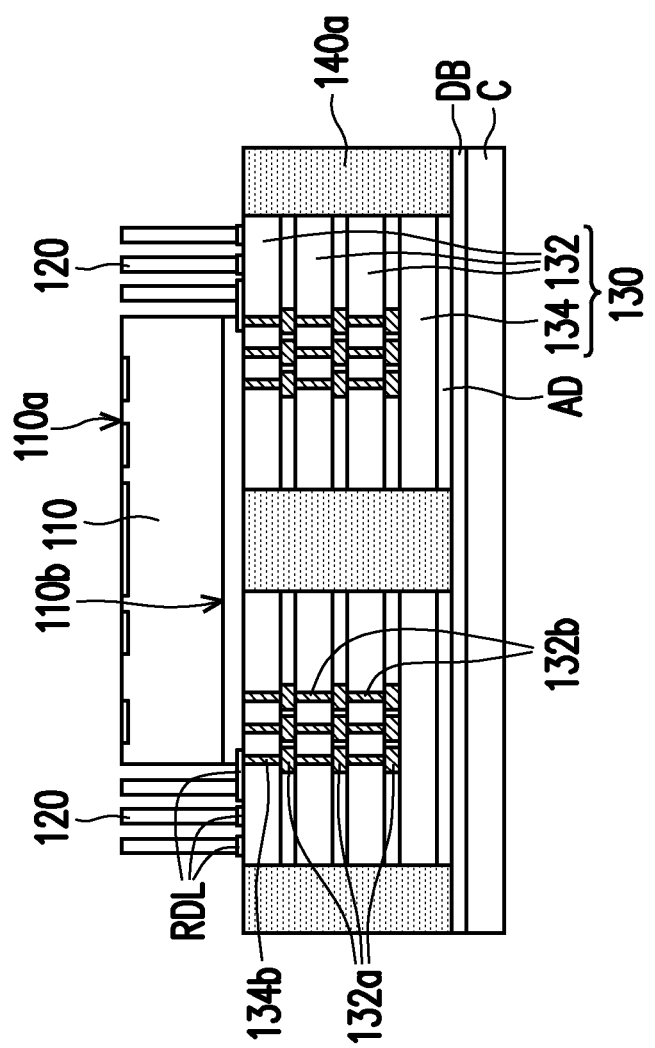

Referring to FIG. 23, after forming the conductive pillars 120, an integrated circuit 110 is picked-up and mounted onto the memory devices 130 and the first insulating portion 140a. For example, integrated circuit 110 is mounted on the memory devices 130 and the first insulating portion 140a via a die-attachment film (DAF) used in the die-bond process. The integrated circuit 110 includes an active surface 110a and a rear surface 110b opposite to the active surface 110a, and the rear surface 110b of the integrated circuit 110 faces the memory devices 130.

Figure 24:
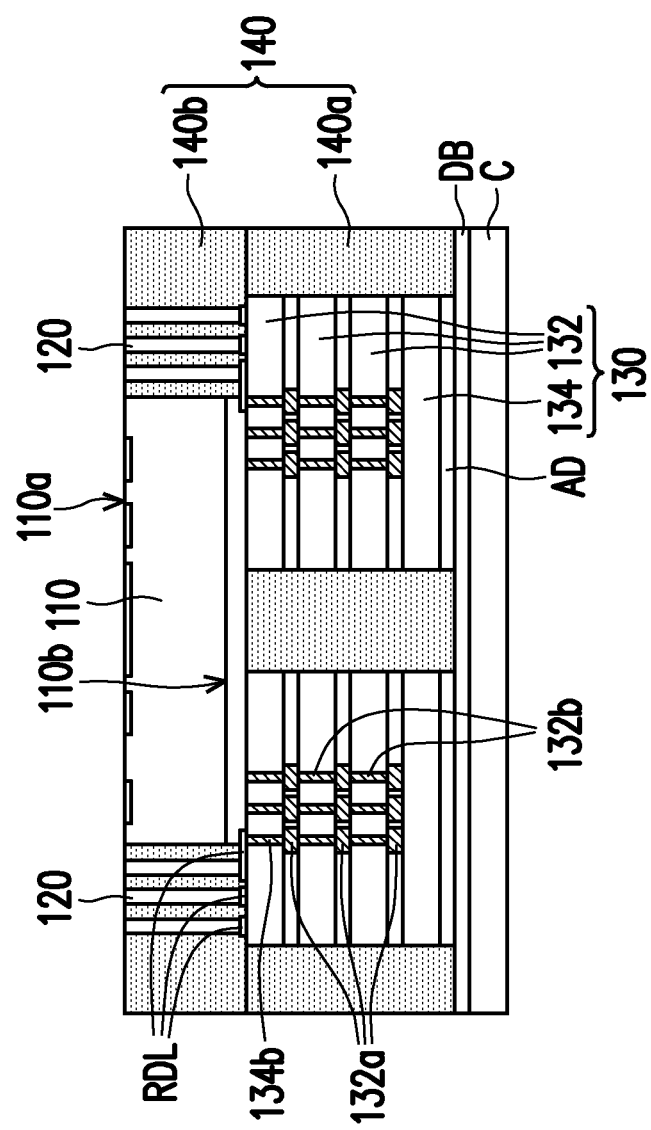

Referring to FIG. 24, a second insulating portion 140b is formed over the first insulating portion 140a to encapsulate and the integrated circuit 110 and the conductive pillars 120. In some embodiments, the second insulating portion 140b may be a molding compound formed by a molding process. The material of the second insulating portion 140b includes epoxy or other suitable dielectric materials. The material of the first insulating portion 140a may be the same as that of the second insulating portion 140b, for example.

The second insulating portion 140b may be formed by a transfer mold process, for example. In some embodiments, an insulating material is formed to encapsulate the integrated circuit 110 and the conductive pillars 120 by the transfer molding process to expose the active surface 110a of the integrated circuit 110 and the top surfaces of the conductive pillars 120. In some embodiments, an insulating material is formed to encapsulate the integrated circuit 110 and the conductive pillars 120 by the over-molding process, and the insulating material is then grinded by a mechanical grinding process and/or a chemical mechanical polishing (CMP) process until the metal post (not shown) of the integrated circuit 110 and the top surfaces of the conductive pillars 120 are exposed.

The first insulating portion 140a and the second insulating portion 140b constitute the insulation encapsulation 140. As shown in FIG. 24, the integrated circuit 110, the conductive pillars 120 and the memory devices 130 are embedded in the insulation encapsulation 140.

Figure 25:
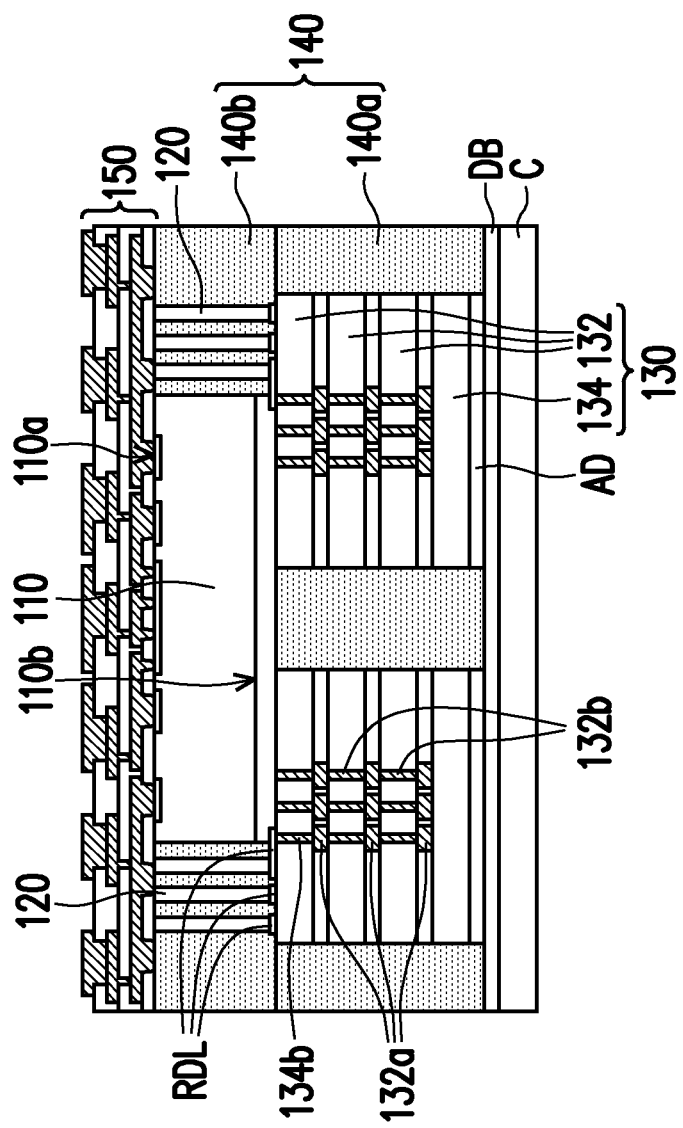

Referring to FIG. 25, after forming the insulating encapsulation 140, a redistribution circuit structure 150 is formed on the top surface of the insulating encapsulation 140, the top surfaces of the conductive pillars 120 and the active surface 110a of the integrated circuit 110. In some embodiments, the redistribution circuit structure 150 is electrically connected to the integrated circuit 110 and the conductive pillars 120, and the redistribution circuit structure 150 is electrically connected to the memory devices 130 through the conductive pillars 120 and the redistribution layer RDL. In other words, the integrated circuit 110 is electrically connected to the memory devices 130 through the redistribution circuit structure 150, the conductive pillars 120 and the redistribution layer RDL.

In some embodiments, the redistribution circuit structure 150 may include a plurality of thermal vias thermally connected to the rear surface 110b of the integrated circuit 110. Through the thermal vias in the redistribution circuit structure 150, the heat generated from the integrated circuit 110 may be conducted and dissipated efficiently.

Figure 26:
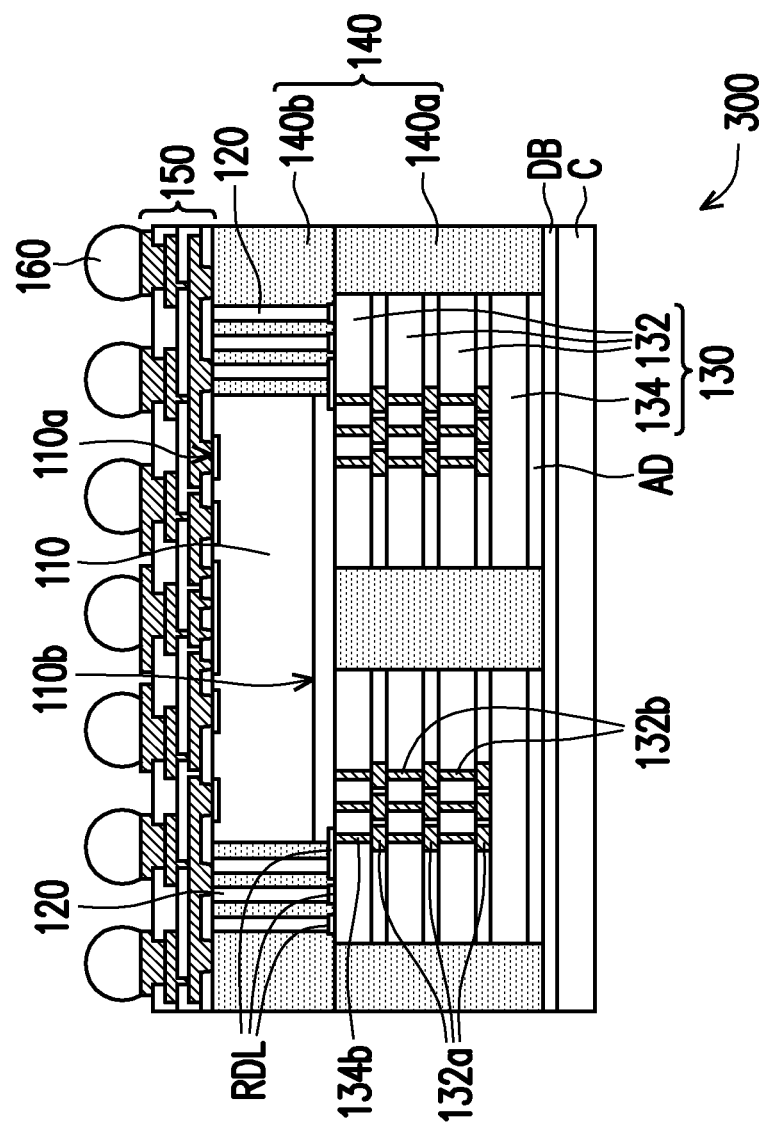

Referring to FIG. 26, after the redistribution circuit structure 150 is formed, a plurality of conductive terminals 160 which are electrically connected to the redistribution circuit structure 150 are formed. As shown in FIG. 26, the integrated circuit 110 is disposed between the redistribution circuit structure 150 and the memory devices 130. In other words, the conductive terminals 160 are distributed at one side of the redistribution circuit structure 150, while the integrated circuit 110 and the memory devices 130 are distributed at the other side of the redistribution circuit structure 150. In some embodiments, the conductive terminals 160 may be conductive bumps or conductive balls.

As shown in FIG. 26, the integrated circuit 110, the memory devices 130, the insulating encapsulation 140 and the redistribution circuit structure 150 are included in the integrated fan-out package 300. The memory devices 130 are electrically connected to the integrated circuit 110 through the redistribution circuit structure 150, the conductive pillars 120, and the redistribution layer RDL, for example. The integrated circuit 110 and the memory devices 130 are stacked. In some embodiments, the conductive terminals 160 may be optionally formed.

Figure 27:
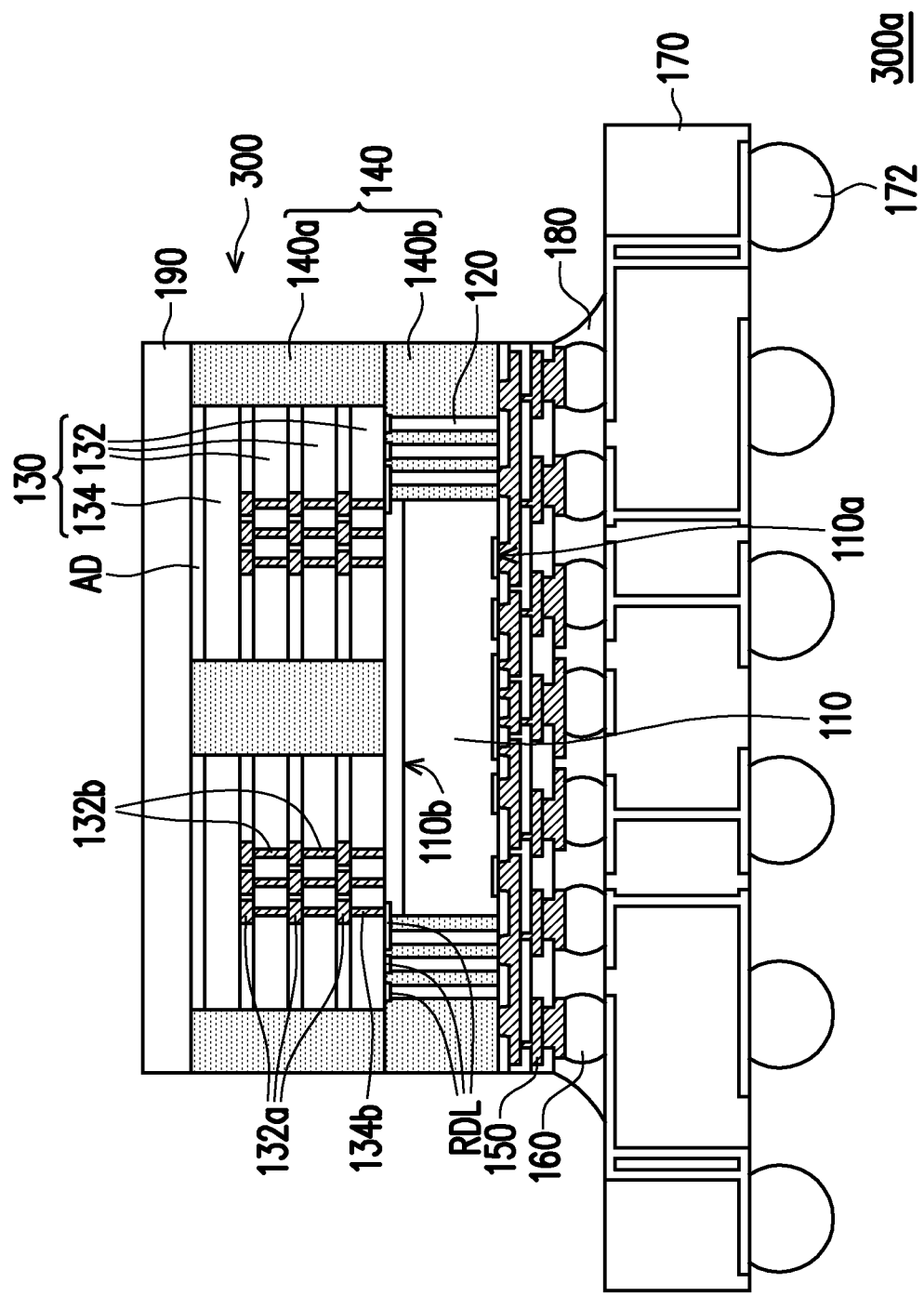

Referring to FIG. 27, the integrated fan-out package 300 is de-bonded from the de-bonding layer DB and the carrier C. In some embodiments, the de-bonding layer DB (e.g., the LTHC release layer) may be irradiated by an UV laser such that the integrated fan-out package 300 is separated from the de-bonding layer DB and the carrier C. The integrated fan-out package 300 may be picked-up and mounted onto a package circuit substrate 170. The redistribution circuit structure 150 in the integrated fan-out package 300 is electrically connected to the package circuit substrate 170 through the conductive terminals 160. In some embodiments, the package circuit substrate 170 may include a plurality of conductive balls 172 distributed on the bottom surface thereof. For example, the conductive balls 172 may be solder balls or other metal balls. It is noted that the arranging pitch between the conductive terminals 160 is less than the arranging pitch between the conductive balls 172.

In other words, the package circuit substrate 170 having the conductive balls 172 distributed thereon may be a ball-grid array (BGA) circuit board, and a ball-grid array (BGA) package 300a including the integrated fan-out package 300 and the package circuit substrate 170 is accomplished.

As shown in FIG. 27, to enhance the bonding reliability of the conductive terminals 160, an underfill 180 may be filled between the redistribution circuit structure 150 and the package circuit substrate 170. The underfill 180 encapsulates the conductive terminals 160 to secure the structural integrity of the conductive terminals 160 and its bonding interfaces at the redistribution circuit structure 150 due to the coefficient of thermal expansion (CTE) mismatch between the redistribution circuit structure 150 and the package circuit substrate 170. In other words, the shearing stress resulted from CTE mismatch may be absorbed by the underfill 180, and the conductive terminals 160 can be protected by the underfill 180.

In some embodiments, to further enhance the thermal dissipation capability, a heat spreader 190 may be adhered on the exposed surfaces of the memory devices 130 and the surface of the insulating encapsulation 140. For example, the material of the heat spreader 190 may include aluminum or other suitable metallic materials.

FIG. 28 is a cross-sectional view illustrating the integrated fan-out package in accordance with some alternative embodiments. Referring to FIG. 28, instead of high bandwidth memory (HBM) cubes, memory devices 130a having architectures which are different from the memory devices 130 (shown in FIG. 27) may be used. It is noted that the number of the memory devices 130a is not limited in this disclosure. Furthermore, the package circuit substrate 170 shown in FIG. 28 is optional in the integrated fan-out package.

In the above-mentioned embodiments, the stacked architectures of the integrated circuit 110 and the memory devices 130 may reduce the distance between the I/O (input/output) interfaces of the integrated circuit 110 and the memory devices 130. Accordingly, the performance (e.g., short signal transmission path between the integrated circuit and the memory devices) of the integrated fan-out packages can be enhanced. Furthermore, due to the stacked architectures of the integrated circuit 110 and the memory devices 130, the compactness of the integrated fan-out packages can be enhanced.

In accordance with some embodiments of the present disclosure, an integrated fan-out package including an integrated circuit, a plurality of memory devices, an insulating encapsulation, and a redistribution circuit structure is provided. The memory devices are electrically connected to the integrated circuit. The integrated circuit and the memory devices are stacked, and the memory devices are embedded in the insulating encapsulation. The redistribution circuit structure is disposed on the insulating encapsulation, and the redistribution circuit structure is electrically connected to the integrated circuit and the memory devices.

In accordance with alternative embodiments of the present disclosure, a method for fabricating integrated fan-out packages including the following steps is provided. A plurality of memory devices are mounted onto a wafer, wherein the wafer includes a plurality of integrated circuits arranged in array, and the memory devices are electrically connected to the integrated circuits. An insulating encapsulation is formed over the wafer to encapsulate and the memory devices. A redistribution circuit structure is formed on the insulating encapsulation and the memory devices, wherein the redistribution circuit structure is electrically connected to the integrated circuits and the memory devices. The redistribution circuit structure, the insulating encapsulation, and the wafer are sawed to form a plurality of singulated packages.

In accordance with yet alternative embodiments of the present disclosure, a method for fabricating an integrated fan-out package including the following steps is provided. A plurality of memory devices are mounted onto a carrier. A first insulating portion of an insulation encapsulation is formed over the carrier to encapsulate and the memory devices. An integrated circuit is mounted onto the memory devices, wherein the integrated circuit is electrically connected to the memory devices. A second insulating portion of the insulation encapsulation is formed over the first insulating portion to encapsulate and the integrated circuit. A redistribution circuit structure is formed on the insulation encapsulation and the integrated circuit, wherein the redistribution circuit structure is electrically connected to the integrated circuit and the memory devices.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A chip package, comprising:
   an integrated circuit chip comprising an active surface;
   at least one memory chip disposed on the active surface of the integrated circuit chip and electrically connected to the integrated circuit chip;
   an insulating encapsulation, laterally encapsulating the at least one memory chip and partially covering the active surface of the integrated circuit chip; and
   a redistribution circuit structure disposed on the at least one memory chip and the insulating encapsulation, the redistribution circuit structure being electrically connected to the integrated circuit chip and the at least one memory chip.

2. The chip package as claimed in claim 1, wherein the integrated circuit chip further comprises a rear surface opposite to the active surface of the integrated circuit chip, and the integrated circuit chip is electrically connected to the at least one memory chip through bumps.

3. The chip package as claimed in claim 1 further comprising conductive pillars penetrating through the insulating encapsulation, wherein the integrated circuit chip is electrically connected to the redistribution circuit structure through conductive pillars.

4. The chip package as claimed in claim 1, wherein at least one memory chip and the insulating encapsulation are disposed between the integrated circuit chip and the redistribution circuit structure.

5. The chip package as claimed in claim 1 further comprising a controller disposed between the at least one memory chip and the redistribution circuit structure, wherein the controller and the at least one memory chip are laterally encapsulated by the insulating encapsulation, and the controller is electrically connected to the integrated circuit chip.

6. The chip package as claimed in claim 5, wherein the at least one memory chip is electrically connected to the controller through bumps.

7. The chip package as claimed in claim 1 further comprising:
conductive terminals electrically connected to the redistribution circuit structure, wherein the redistribution circuit structure is between the conductive terminals and the at least one memory chip.

8. The chip package as claimed in claim 7 further comprising:
a package circuit substrate, wherein the redistribution circuit structure is electrically connected to the package circuit substrate through the conductive terminals.

9. A chip package, comprising:
an integrated circuit chip comprising an active surface and a rear surface opposite to the active surface;
memory chips disposed over the rear surface of the integrated circuit chip, wherein the memory chips are electrically connected to the integrated circuit chip;
an insulating encapsulation laterally encapsulating the integrated circuit chip and the memory chips; and
a redistribution circuit structure disposed on the active surface of the integrated circuit chip and a surface of the insulating encapsulation, and the redistribution circuit structure being electrically connected to the integrated circuit chip and the memory chips.

10. The chip package as claimed in claim 9, wherein the integrated circuit chip is between the redistribution circuit structure and the memory chips.

11. The chip package as claimed in claim 9, wherein a second insulating portion of the insulating encapsulation partially covers the rear surface of the integrated circuit chip and a first insulating portion of the insulating encapsulation.

12. The chip package as claimed in claim 11 further comprising:
a plurality of conductive pillars penetrating through the first insulating portion of the insulating encapsulation, the memory chips being electrically connected to the redistribution circuit structure through the conductive pillars; and
a redistribution layer on surfaces of the memory chips, wherein the integrated circuit chip is electrically connected to the memory chips through the redistribution circuit structure, the plurality of conductive pillars and the redistribution layer.

13. The chip package as claimed in claim 9 further comprising:
a plurality of conductive terminals electrically connected to the redistribution circuit structure, wherein the redistribution circuit structure is between the conductive terminals and the integrated circuit chip.

14. The chip package as claimed in claim 13 further comprising:
a package circuit substrate, wherein the redistribution circuit structure is electrically connected to the package circuit substrate through the conductive terminals.

15. A chip package, comprising:
an integrated circuit chip comprising an active surface and a rear surface opposite to the active surface;
memory chips disposed over the active surface of the integrated circuit chip, wherein the memory chips are electrically connected to the integrated circuit chip;
an insulating encapsulation laterally encapsulating the integrated circuit chip and the memory chips, the memory chips being disposed over a first insulating portion of the insulating encapsulation; and
a redistribution circuit structure disposed on the rear surface of the integrated circuit chip and a surface of the insulating encapsulation, and the redistribution circuit structure being electrically connected to the integrated circuit chip and the memory chips.

16. The chip package as claimed in claim 15, wherein the integrated circuit chip is disposed between the redistribution circuit structure and the memory chips.

17. The chip package as claimed in claim 15 further comprising:
conductive terminals electrically connected to the redistribution circuit structure, wherein the redistribution circuit structure is between the conductive terminals and the integrated circuit chip.

18. The chip package as claimed in claim 17 further comprising:
a package circuit substrate, wherein the redistribution circuit structure is electrically connected to the package circuit substrate through the conductive terminals.

19. The chip package as claimed in claim 15, wherein a second insulating portion of the insulating encapsulation partially covers the active surface of the integrated circuit chip and a first insulating portion of the insulating encapsulation.

20. The chip package as claimed in claim 19 further comprising:
conductive pillars penetrating through the first insulating portion of the insulating encapsulation, the memory chips being electrically connected to the redistribution circuit structure through the conductive pillars; and
a redistribution layer on surfaces of the memory chips, wherein the integrated circuit chip is electrically connected to the memory chips through the redistribution circuit structure, the conductive pillars and the redistribution layer.

* * * * *